US008929847B2

United States Patent
Chung et al.

(12) United States Patent
Chung et al.

(10) Patent No.: US 8,929,847 B2
(45) Date of Patent: *Jan. 6, 2015

(54) SIGNAL PROCESSING CIRCUIT WITH CIRCUIT INDUCED NOISE CANCELLATION

(71) Applicant: Mediatek Inc., Hsin-Chu (TW)

(72) Inventors: Yuan-Hung Chung, Hsinchu County (TW); Yi-Shing Shih, Changhua County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/258,038

(22) Filed: Apr. 22, 2014

(65) Prior Publication Data

US 2014/0220922 A1 Aug. 7, 2014

Related U.S. Application Data

(63) Continuation of application No. 13/792,224, filed on Mar. 11, 2013, now Pat. No. 8,750,818.

(60) Provisional application No. 61/623,761, filed on Apr. 13, 2012, provisional application No. 61/645,223, filed on May 10, 2012.

(51) Int. Cl.
| | |
|---|---|
| *H04B 1/10* | (2006.01) |
| *H04B 1/12* | (2006.01) |
| *H03F 1/26* | (2006.01) |
| *H03F 1/56* | (2006.01) |
| *H03F 3/19* | (2006.01) |
| *H03F 3/45* | (2006.01) |
| *H03D 7/14* | (2006.01) |

(52) U.S. Cl.
CPC .. *H04B 1/12* (2013.01); *H03F 1/26* (2013.01); *H03F 1/56* (2013.01); *H03F 3/19* (2013.01); *H03F 3/45475* (2013.01); *H03D 7/1441* (2013.01); *H03D 7/1458* (2013.01); *H03D 7/1466* (2013.01); *H03F 2200/294* (2013.01)
USPC ........................................... 455/305; 455/296

(58) Field of Classification Search
USPC .............. 455/193.1, 280, 283, 288, 296, 303, 455/305

See application file for complete search history.

(56) References Cited

U.S. PATENT DOCUMENTS

| | | |
|---|---|---|
| 7,299,025 B1 | 11/2007 | Wong |
| 8,041,327 B2 | 10/2011 | Youssoufian |

(Continued)

OTHER PUBLICATIONS

Bruccoleri, Wide-Band CMOS Low-Noise Amplifier Exploiting Thermal Noise Canceling, IEEE Journal of Solid-State Circuits, vol. 39, No. 2, pp. 275-282, February 2004.

(Continued)

*Primary Examiner* — Blane J Jackson
(74) *Attorney, Agent, or Firm* — Winston Hsu; Scott Margo

(57) ABSTRACT

A signal processing circuit with noise cancellation includes an impedance matching unit and a transconductance stage. The impedance matching unit is disposed at a first path, and arranged to provide input impedance matching, wherein the impedance matching unit is a passive element, and the first path is coupled between a signal input port and a signal output port. The transconductance stage is disposed at a second path, and arranged to guide circuit introduced noise to the signal output port for noise cancellation at the signal output port, wherein the second path is coupled between the signal input port and the signal output port.

22 Claims, 25 Drawing Sheets

(56) References Cited

U.S. PATENT DOCUMENTS

| | | |
|---|---|---|
| 8,244,195 B2 | 8/2012 | Wilson |
| 8,301,101 B2 * | 10/2012 | Mirzaei et al. ............... 455/293 |
| 8,515,380 B2 | 8/2013 | Rentala |
| 2006/0220714 A1 | 10/2006 | Hur |
| 2009/0088124 A1 | 4/2009 | Schuur |
| 2011/0028115 A1 | 2/2011 | Mirzaei |
| 2011/0105067 A1 | 5/2011 | Wilson |

OTHER PUBLICATIONS

Murphy, A Blocker-Tolerant Wideband Noise-Cancelling Receiver with a 2dB Noise Figure, pp. 74-75 and a page including Figure 4.1.7, ISSCC 2012/ Session 4/ RF Techniques/ 4.1, 2012.

* cited by examiner

US 8,929,847 B2

SIGNAL PROCESSING CIRCUIT WITH CIRCUIT INDUCED NOISE CANCELLATION

CROSS REFERENCE TO RELATED APPLICATIONS

This is a continuation of U.S. application Ser. No. 13/792,224 (filed on Mar. 11, 2013), which claims the benefit of U.S. provisional application No. 61/623,761 (filed on Apr. 13, 2012) and U.S. provisional application No. 61/645,223 (filed on May 10, 2012). The entire contents of these related applications are incorporated herein by reference.

BACKGROUND

The disclosed embodiments of the present invention relate to noise cancellation, and more particularly, to a signal processing circuit with circuit induced noise cancellation.

Regarding a conventional low-noise amplifier (LNA), an inductor degeneration design is employed to provide the real part for impedance and noise matching. However, such an inductor degeneration based LNA design would consume a large chip area. Thus, other noise cancellation techniques are proposed to provide wide-band matching and give lower noise figure. However, regarding these conventional noise cancellation techniques, there is always a trade-off in linearity, noise figure, chip area, and current consumption. Besides, the conventional noise cancellation technique is not current scalable for different applications, especially low-power applications. Moreover, due to advance of the semiconductor process, the flicker noise of the transistor will be very worse. The conventional noise cancellation technique deals with the flicker noise at the expense of current consumption of the transistor and/or size of the transistor.

Thus, there is a need for an improved noise cancellation design which is current scalable and capable of cancelling the flicker noise without a trade-off in the current consumption and noise performance.

SUMMARY OF THE INVENTION

In accordance with exemplary embodiments of the present invention, a signal processing circuit with circuit induced noise cancellation is proposed to solve the above-mentioned problems.

According to a first aspect of the present invention, an exemplary signal processing circuit with noise cancellation is disclosed. The exemplary signal processing circuit includes an impedance matching unit and a transconductance stage. The impedance matching unit is disposed at a first path, and arranged to provide input impedance matching, wherein the impedance matching unit is a passive element, and the first path is coupled between a signal input port and a signal output port. The transconductance stage is disposed at a second path, and arranged to guide circuit introduced noise to the signal output port for noise cancellation at the signal output port, wherein the second path is coupled between the signal input port and the signal output port.

According to a second aspect of the present invention, an exemplary signal processing circuit with noise cancellation is disclosed. The exemplary signal processing circuit includes a first voltage-to-current converting unit, a second voltage-to-current converting unit, and a current-mode noise cancellation unit. The first voltage-to-current converting unit is arranged to convert a voltage input into a first current output. The second voltage-to-current converting unit is arranged to convert the voltage input into a second current output. The current-mode noise cancellation unit is arranged to combine a plurality of current signals derived from the first current output and the second current output for circuit introduced noise cancellation. One of the first voltage-to-current converting unit and the second voltage-to-current converting unit is a passive element.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
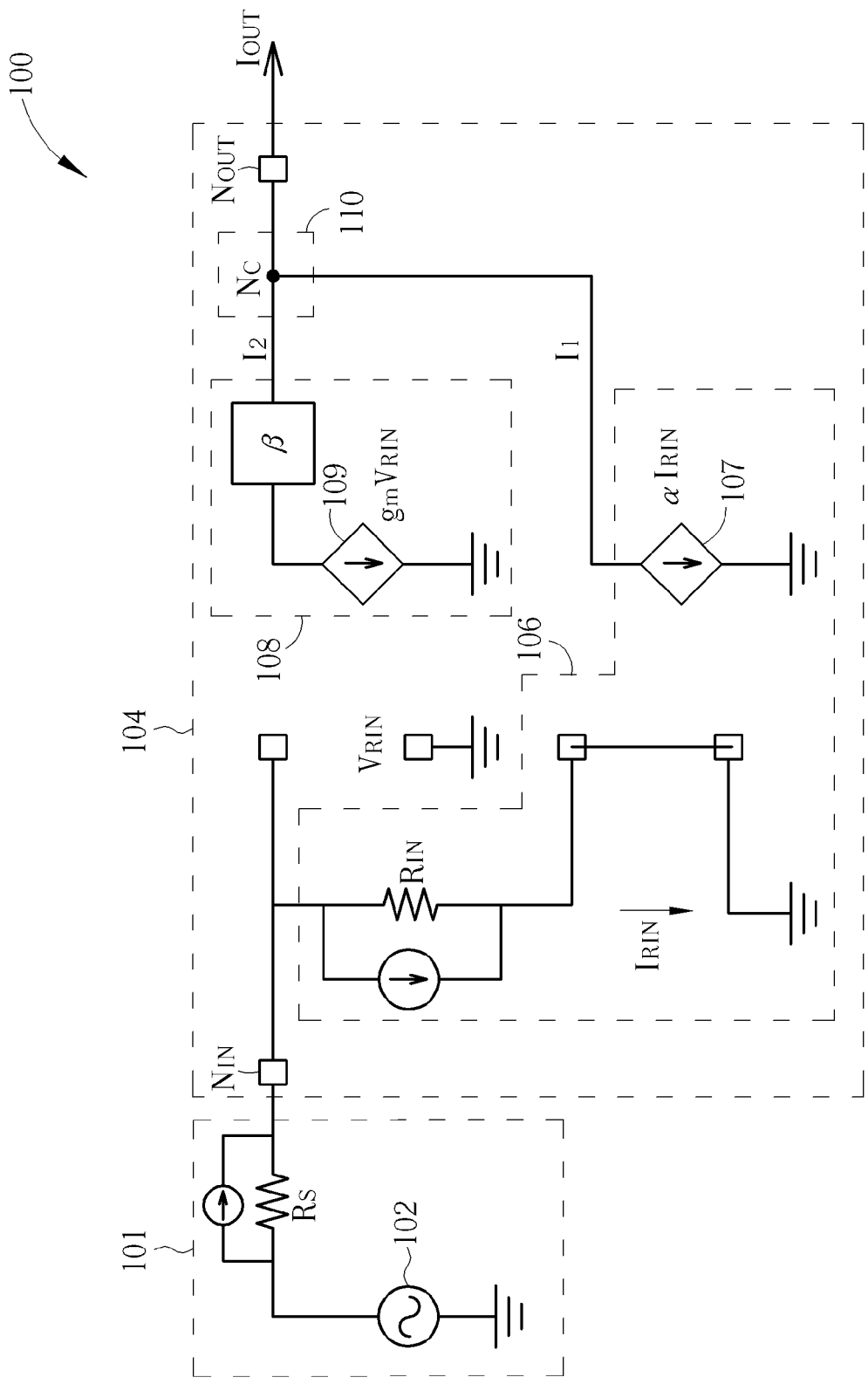
FIG. 1 is a diagram illustrating a proposed noise cancellation concept of the present invention.

Please refer to FIG. 1, which is a diagram illustrating a proposed noise cancellation concept of the present invention. The proposed noise cancellation concept may be employed in a frontend of a wireless receiver. However, this is for illustrative purposes only, and is not meant to be a limitation of the present invention. In practice, any circuit using the proposed noise cancellation concept falls within the scope of the present invention. An antenna 101 of a wireless receiver 100 is modeled by a current source 102 and a resistor $R_S$. The frontend 104 of the wireless receiver 100 includes a first voltage-to-current converting unit 106, a second voltage-to-current converting unit 108, and a current-mode noise cancellation unit 110. The first voltage-to-current converting unit 106 is coupled to a signal input port $N_{IN}$, and arranged to process a voltage input $V_{RIN}$ generated due to the wireless communication signal received by the antenna 101. As shown in FIG. 1, the first voltage- to-current converting unit 106 includes an impedance-matching resistor $R_{IN}$. Hence, the voltage input $V_{RIN}$ is converted into a first current output $I_{RIN}$, where $I_{RIN}=V_{RIN}/R_{IN}$. The first current output $I_{RIN}$ may be scaled by an optional first scaling factor $\alpha$, where an output current $I_1$ is equal to $I_{RIN}$ when $\alpha=1$ (i.e., no scaling is employed), and the output current $I_1$ is smaller than $I_{RIN}$ when $\alpha=1$ (i.e., scaling is employed). To put it simply, a current-controlled current source 107 is present due to the impedance-matching resistor $R_{IN}$.

The second voltage-to-current converting unit 108 is also coupled to the signal input port $N_{IN}$, and arranged to process the voltage input $V_{RIN}$. As shown in FIG. 1, the second voltage-to-current converting unit 108 includes a transconductance unit 109. Hence, the voltage input $V_{RIN}$ is converted into a second current output $g_m V_{RIN}$, where $g_m$ is the transconductance value possessed by the transconductance unit 109. The second current output $g_m V_{RIN}$ may be scaled by an optional second scaling factor $\beta$, where an output current $I_2$ is equal to $g_m V_{RIN}$ when $\beta=1$ (i.e., no scaling is employed), and the output current $I_2$ is smaller than $g_m V_{RIN}$ when $\beta<1$ (i.e., scaling is employed). To put it simply, the transconductance unit 109 acts as a voltage-controlled current source.

The current-mode noise cancellation unit 110 is simply implemented using an interconnection node $N_c$ of the first voltage-to-current converting unit 106 and the second voltage-to-current converting unit 108. Specifically, the current-mode noise cancellation unit 110 is arranged to combine a plurality of current signals $I_1$ and $I_2$ derived from the first current output $I_{RIN}$ and the second current output $g_m V_{RIN}$ for circuit introduced noise cancellation. In this way, a noise-cancelled output current $I_{OUT}$ is generated from a signal output port $N_{OUT}$ of the frontend 104 to the following signal processing stage (e.g., a transimpedance amplifier).

The noise current of the impedance-matching resistor $R_{IN}$ at the receiver input (i.e., the signal input port $N_{IN}$) can be cancelled by measuring the current passing through the impedance-matching resistor $R_{IN}$ and the voltage $V_{RIN}$ at the signal input port $N_{IN}$. Besides, the input matching can be easily achieved if $R_{IN}$ equals $R_S$.

It should be noted that the impedance-matching resistor $R_{IN}$ is a bilateral element which is capable of passing signals in opposite directions. Hence, circuit induced noise (e.g., thermal noise/flicker noise) to be cancelled may be transmitted from an internal circuit element (e.g., the impedance-matching resistor $R_{IN}$) to the transconductance unit 109, and then cancelled at the interconnection node $N_c$/signal output port $N_{OUT}$. More specifically, unwanted circuit induced noise components with opposite phases are combined at the interconnection node $N_c$/signal output port $N_{OUT}$, whereas wanted signal components with the same phase are combined at the interconnection node $N_c$/signal output port $N_{OUT}$. In accordance with the proposed noise cancellation concept, the noise cancellation occurs in the current mode, which is beneficial to chip area and power consumption. Besides, as the noise cancellation occurs in the current mode, the linearity can be kept.

In the following, several circuit implementations based on the proposed noise cancellation concept illustrated in FIG. 1 are provided for better understanding of technical features of the present invention.

Figure 2:
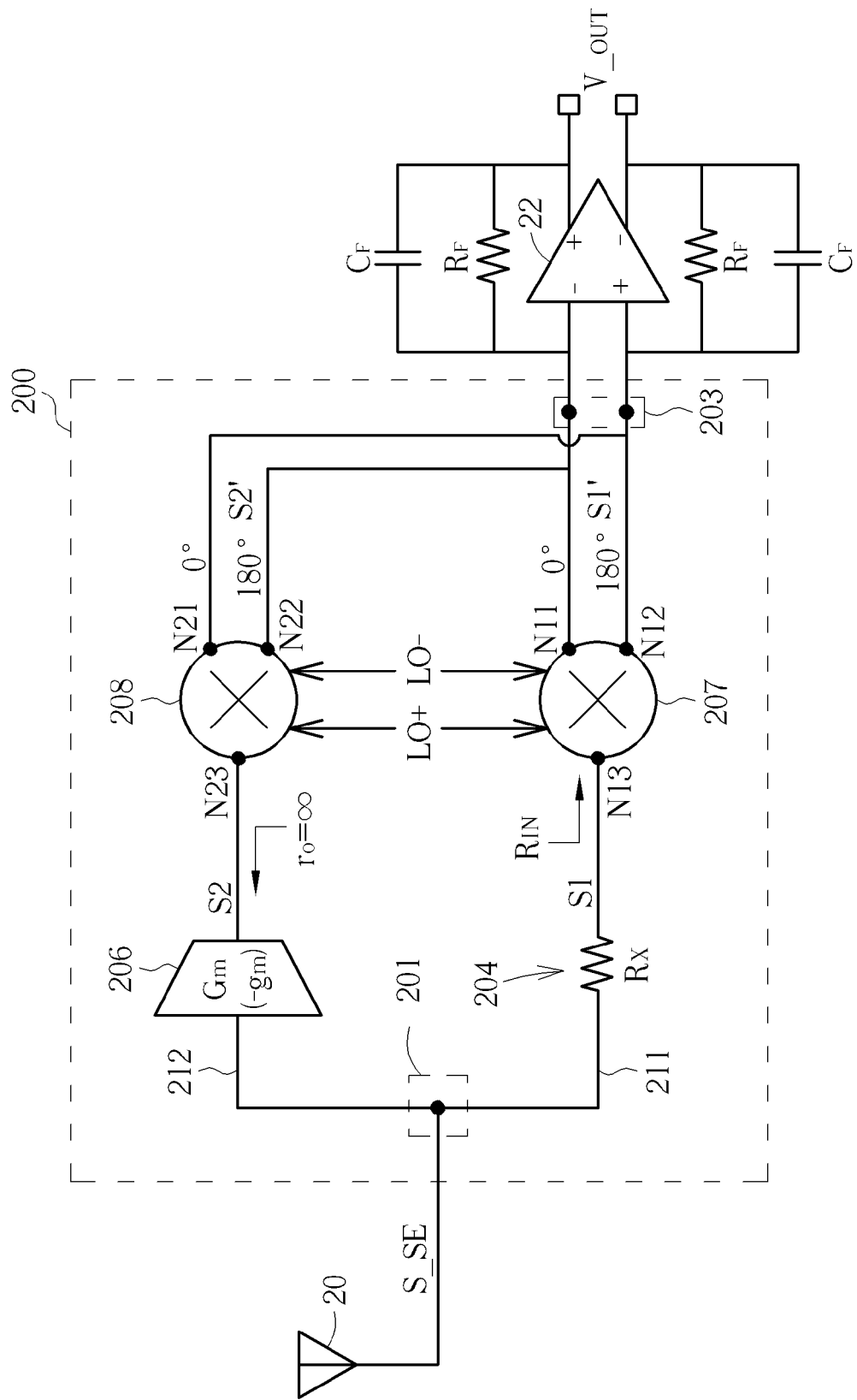
FIG. 2 is a diagram illustrating a signal processing circuit with single-ended topology according to a first embodiment of the present invention.

FIG. 2 is a diagram illustrating a signal processing circuit with single-ended topology according to a first embodiment of the present invention. The signal processing circuit 200 is part of a frontend of a wireless receiver. Specifically, the receiver frontend may include the signal processing circuit 200 and a differential transimpedance amplifier 22. Hence, a signal input port 201 is coupled to a preceding antenna 20, and a signal output port 203 is coupled to the following differential transimpedance amplifier 22 with feedback resistors $R_F$ and feedback capacitors $C_F$. In this embodiment, the signal processing circuit 200 includes an impedance matching unit 204, a transconductance stage 206, a first passive mixer 207, and a second passive mixer 208, where the impedance matching unit 204 and the first passive mixer 207 are both disposed at a first path (e.g., a main path) 211, and the transconductance stage 206 and the second passive mixer 208 are both disposed at a second path (e.g., an auxiliary path) 212. As can be seen from FIG. 2, the first path 211 is coupled between the signal input port 201 and the signal output port 203, and the second path 212 is also coupled between the signal input port 201 and the signal output port 203. In other words, the first path 211 and the second path 212 are connected in parallel.

In this embodiment, a single-ended signal S_SE is received at the signal input port 201, and processed by the impedance matching unit 204 and the transconductance stage 206, respectively. Specifically, the impedance matching unit 204 is arranged to provide input impedance matching. The impedance matching unit 204 is a bilateral element, such as a resistor with a resistance value $R_X$. The first path 211 accounts for input matching. Hence, in a case where the input impedance viewed from the signal input port 201 is $R_S$ (e.g., the antenna 20 has an impedance value equal to $R_S$), the input impedance matching criterion is met when $R_{IN}+R_X=R_S$, where $R_{IN}$ represents a resistance value looking into the first passive mixer 207. Regarding the transconductance stage 206, it is capable of guiding circuit introduced noise from the first path 211 to the signal output port 203 for noise cancellation at the signal output port 203. Further details are described later.

Figure 3:
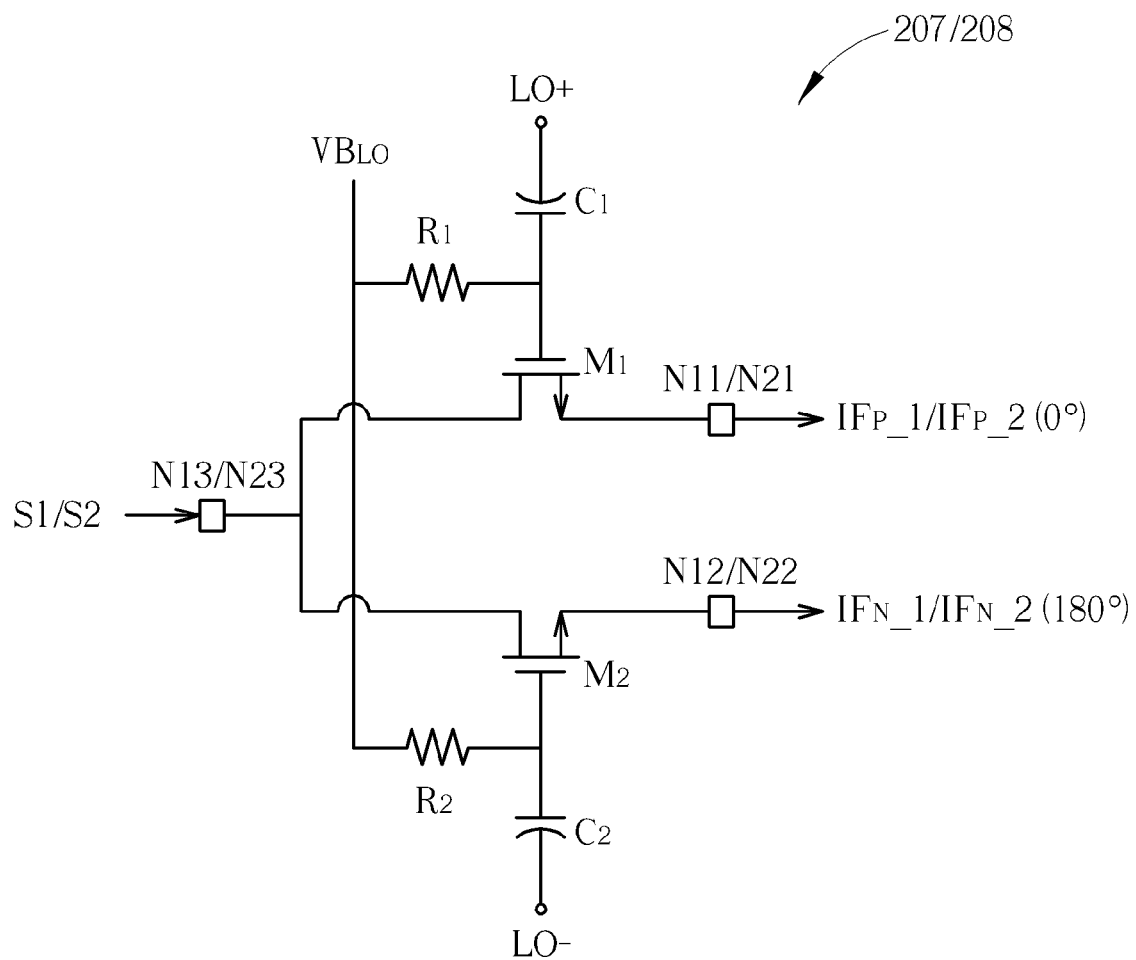
FIG. 3 is a circuit diagram illustrating an exemplary implementation of each of the first passive mixer and the second passive mixer shown in FIG. 2 according to the present invention.

The first passive mixer 207 is arranged to mix an output S1 of the impedance matching unit 204 with a local oscillator (LO) output, where the LO output includes a first LO signal LO+ and a second LO signal LO− having a 180-degree phase difference therebetween. The second passive mixer 208 is arranged to mix an output S2 of the transconductance stage 206 with the LO output. Please refer to FIG. 3, which is a circuit diagram illustrating an exemplary implementation of each of the first passive mixer 207 and the second passive mixer 208 shown in FIG. 2 according to the present invention. As shown in FIG. 3, the passive mixer 207/208 includes a plurality of resistors $R_1$, $R_2$, a plurality of capacitors $C_1$, $C_2$, and a plurality of transistors $M_1$, $M_2$. Besides, the transistors $M_1$, $M_2$ are biased by $VB_{LO}$. As a result, a positive signal $IF_{P\_1}$ and a negative signal $IF_{N\_1}$ of a first differential mixer output S1' is generated from a first output node N11 and a second output node N12 of the first passive mixer 207 according to the signal S1 received at an input node N13; similarly, a positive signal $IF_{P\_2}$ and a negative signal $IF_{N\_2}$ of a second differential mixer output S2' is generated from a first output node N21 and a second output node N22 of the second passive mixer 208 according to the signal S2 received at an input node N23. Preferably, an additional capacitor (not shown) may be coupled between the first output node N11/N21 and the second output node N12/N22. When the capacitance value of the additional capacitor is increased, the effective quality factor (Q) is increased, which means better output blocker rejection.

The output currents of the first passive mixer 207 and the second passive mixer 208 are combined at the signal output port 203, and then the following transimpedance amplifier 22 converts a current output received from the signal output port 203 into a corresponding voltage output $V_{\_OUT}$. It should be noted that the first passive mixer 207 is also a bilateral element. Assume that the output resistance value $r_o$ of the transconductance stage 206 is infinitely large. The circuit introduced noise of the internal circuit elements (e.g., impedance matching unit 204, first passive mixer 207 and differential transimpedance amplifier 22) may be transmitted via the second path 212 to reach the signal output port 203, and then combined with the circuit introduced noise present at the signal output port 203 for noise cancellation.

Figure 4:
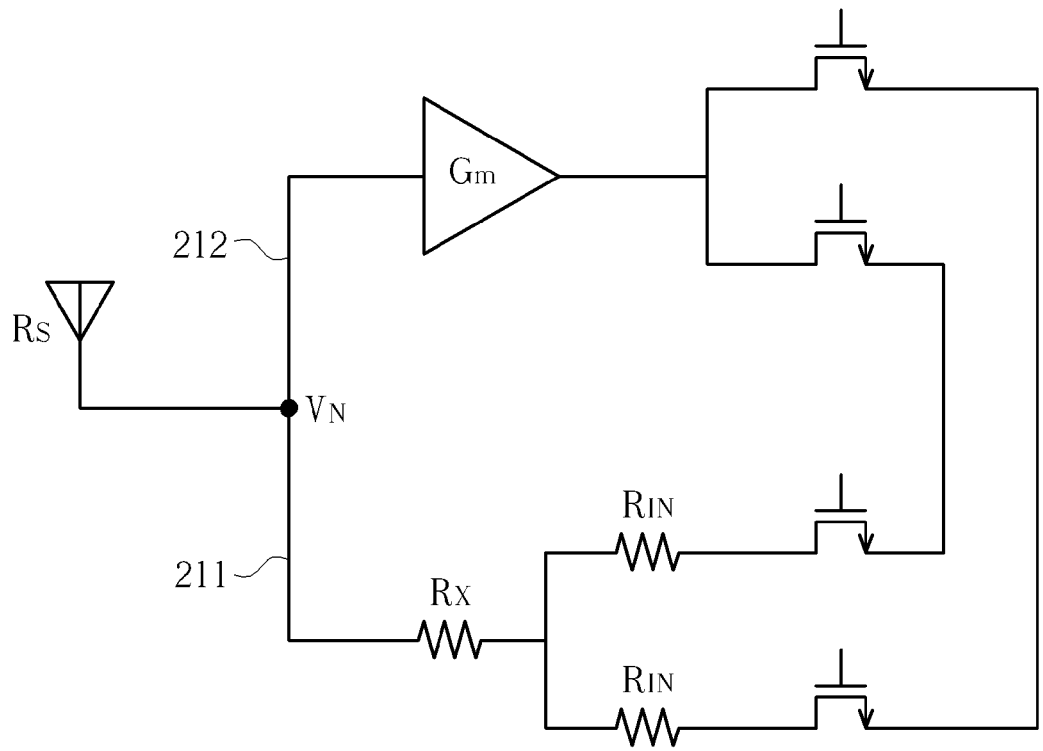
FIG. 4 is a diagram illustrating an electrical analysis of the circuit shown in FIG. 2.

Please refer to FIG. 4, which is a diagram illustrating an electrical analysis of the circuit shown in FIG. 2. The noise voltage $V_N$ from the first path 211 to be appeared at the signal input port causes a noise current at the second path 212, where the noise voltage $V_N$ is composed of circuit introduced noise of the impedance matching unit 204, the first passive mixer 207 and the differential transimpedance amplifier 22. To reach the noise cancellation, the noise currents in the first path 211 and the second path 212 should be equal.

$$G_m \cdot V_N = \frac{V_N}{R_X + R_{IN}} \quad (1)$$

$$G_m \cdot (R_X + R_{IN}) = 1 \quad (2)$$

When the input impedance matching criterion is met, $R_S$ is equal to $R_{IN}+R_X$. Thus, the above equation (2) may be written as below.

$$G \cdot R_S = 1 \quad (3)$$

Therefore, when the condition expressed in equation (3) is satisfied, the desired noise cancellation at the signal output port is achieved.

As mentioned above, the circuit introduced noise originally present at the signal output port 203 and the circuit introduced noise guided by the second path 212 should be out of phase. Regarding the example shown in FIG. 2, the transconductance stage 206 has a negative transconductance value $-g_m$ such that a product of the input impedance $R_S$ viewed from the signal input port 201 and the transconductance magnitude $G_m$ (i.e., $Gm=|-g_m|=g_m$) of the transconductance stage 206 is equal to one. However, as the transconductance stage 206 has a negative transconductance value instead of a positive transconductance value, the first output bode N11 of the first passive mixer 207 should be coupled to the second output node N22 of the second passive mixer 208, and the second output bode N12 of the first passive mixer 207 should be coupled to the first output node N21 of the second passive mixer 208.

Alternatively, the transconductance stage at the second path may be configured to have a positive transconductance value. Please refer to FIG. 5, which is a diagram illustrating a signal processing circuit with single-ended topology according to a second embodiment of the present invention. The major difference between the signal processing circuits 200 and 500 is that the transconductance stage 506 has a positive transconductance value $g_m$, where a product of the input impedance $R_S$ viewed from the signal input port 201 and the transconductance magnitude $G_m$ (i.e., $Gm=g_m$) of the transconductance stage 506 is still equal to one. However, as the transconductance stage 506 has a positive transconductance value instead of a negative transconductance value, the first output bode N11 of the first passive mixer 207 should be coupled to the first output node N21 of the second passive mixer 208, and the second output bode N12 of the first passive mixer 207 should be coupled to the second output node N22 of the second passive mixer 208. The same objective of providing noise cancellation at the signal output port 203 is achieved.

Figure 5:
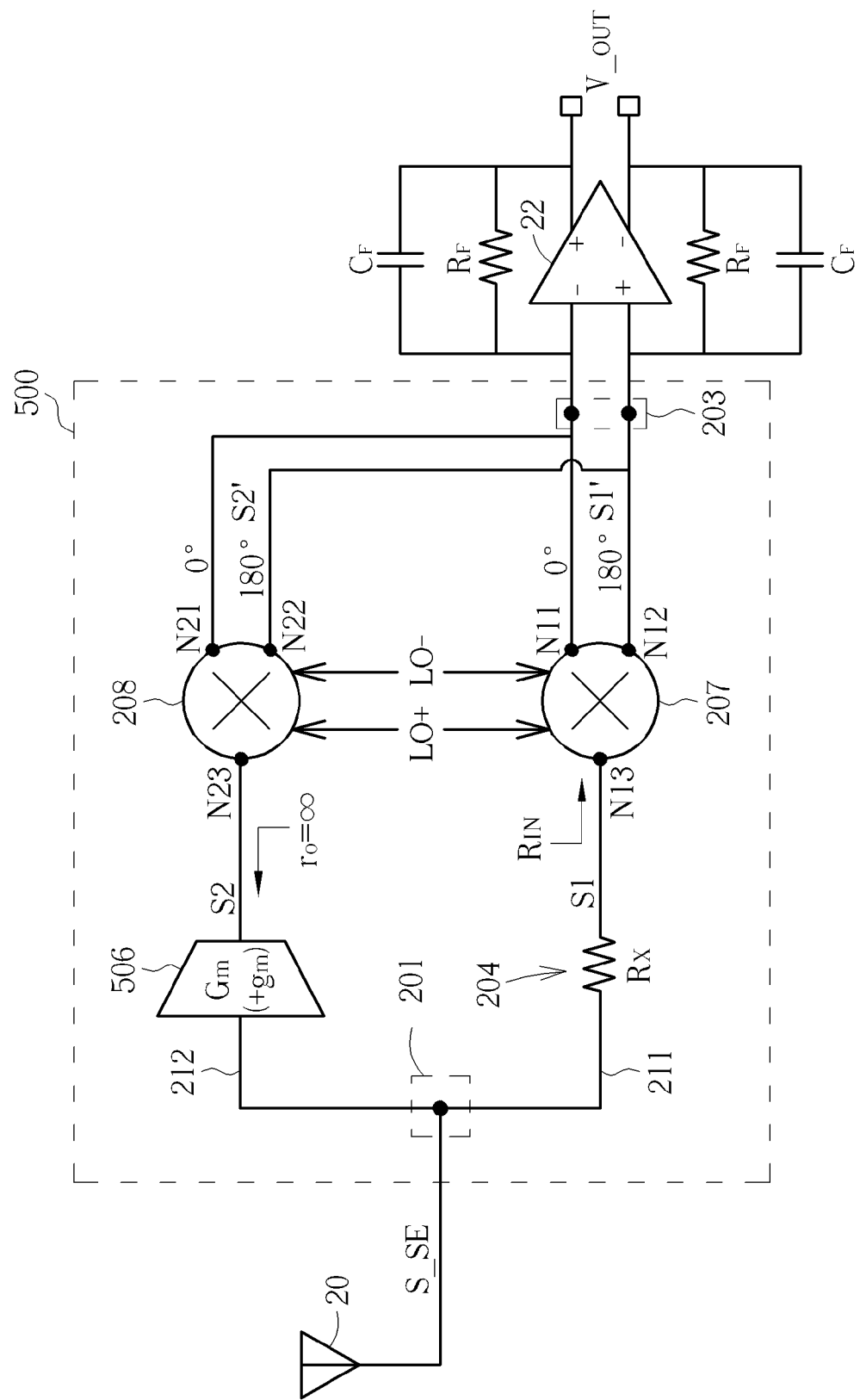
FIG. 5 is a diagram illustrating a signal processing circuit with single-ended topology according to a second embodiment of the present invention.
Figure 6:
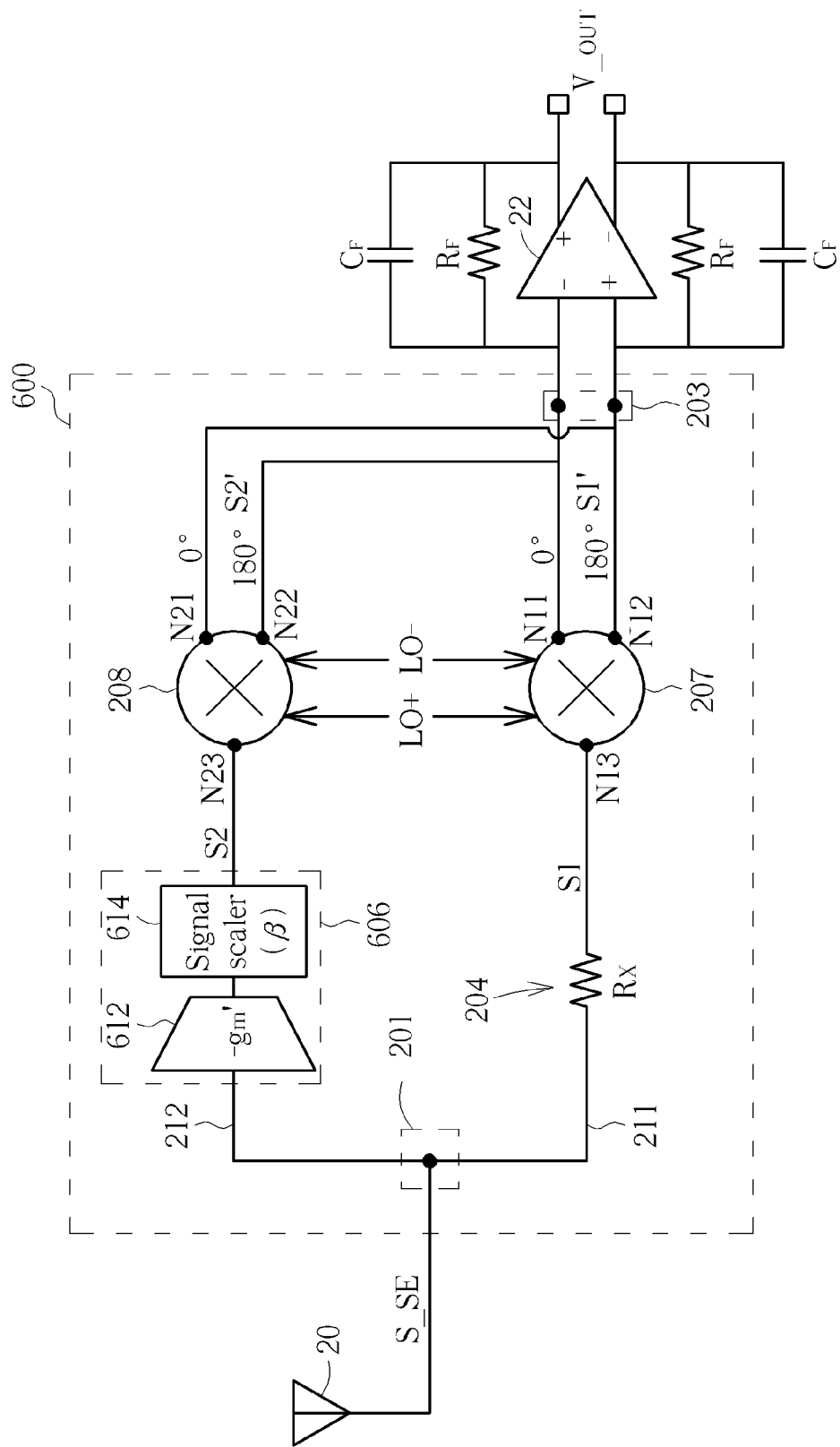
FIG. 6 is a diagram illustrating a signal processing circuit with single-ended topology according to a third embodiment of the present invention.

As mentioned above, no matter whether the transconductance stage is configured to have a positive transconductance value or a negative transconductance value, the noise cancellation condition defined by equation (3) should be satisfied. Thus, the transconductance value of the transconductance stage is limited by the input impedance $R_S$. To put it another way, the noise figure (NF) of the circuit shown in FIG. 2/FIG. 5 is dominated by the second path 212, which is limited by the input matching. To improve the NF, the dominant noise factor from the transconductance stage 206/506 itself needs to be reduced. FIG. 6 is a diagram illustrating a signal processing circuit with single-ended topology according to a third embodiment of the present invention. The major difference between the signal processing circuits 200 and 600 is that the transconductance stage 606 includes a transconductance unit 612 and a signal scaler 614 connected in series. It should be noted that the transconductance unit 612 has a negative transconductance value $-g_m'$, and the signal scaler 614 applies a noiseless scaling factor $\beta$ to the output of the transconductance unit 612, where $\beta<1$. It should be noted that $|-g_m'|\times\beta=G_m$. Thus, the overall transconductance magnitude of the transconductance stage 606 is equal to that of the transconductance stage 206. However, $g_m'$ would be greater than $g_m$.

Figure 7:
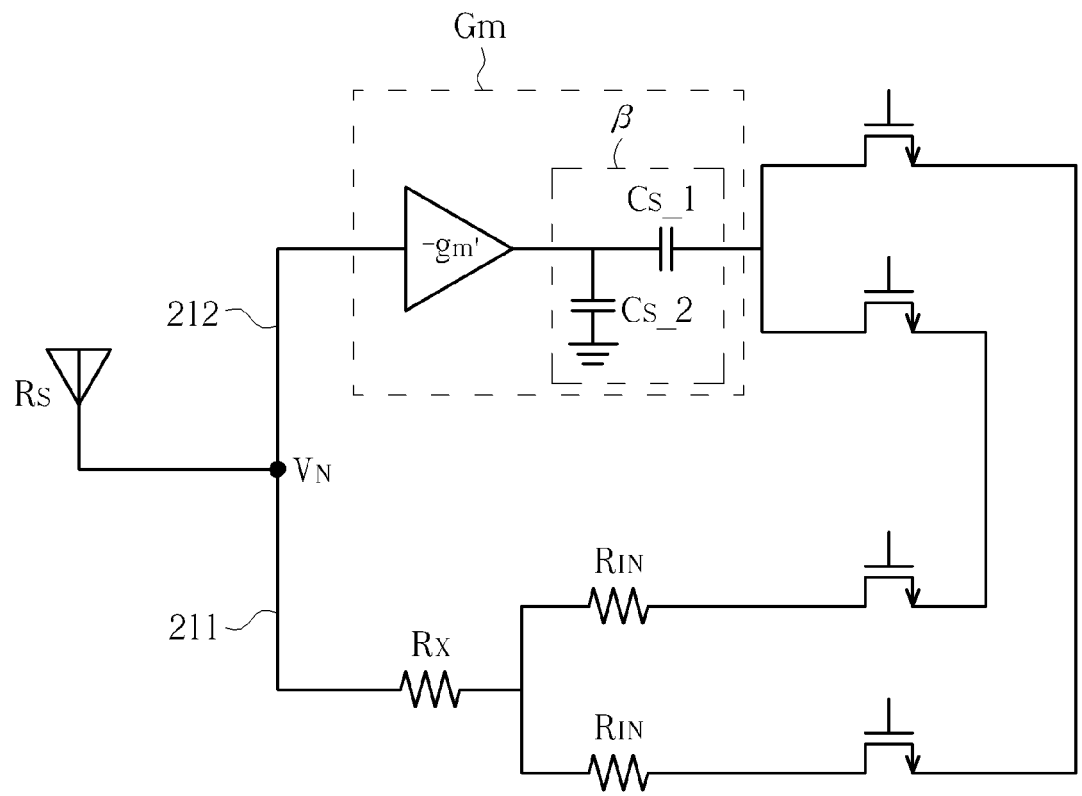
FIG. 7 is a diagram illustrating an electrical analysis of the circuit shown in FIG. 6.

Please refer to FIG. 7, which is a diagram illustrating an electrical analysis of the circuit shown in FIG. 6. The noise voltage $V_N$ from the first path 211 to be appeared at the signal input port causes a noise current at the second path 212, where the noise voltage $V_N$ is composed of circuit introduced noise of internal circuit elements (e.g., impedance matching unit 204, first passive mixer 207 and differential transimpedance amplifier 22). To reach the noise cancellation, the noise currents in the first path 211 and the second path 212 should be equal.

$$g_m' \cdot V_N \cdot \beta = \frac{V_N}{R_X + R_{IN}} \quad (4)$$

$$g_m' = \frac{1}{\beta \cdot (R_X + R_{IN})} \quad (5)$$

When the input impedance matching criterion is met, $R_S$ is equal to $R_{IN}+R_X$. Thus, the above equation (5) may be written as below.

$$g_m' = \frac{1}{\beta \cdot R_S} \quad (6)$$

Hence, when the condition expressed in equation (6) is satisfied, the desired noise cancellation at the signal output port is achieved.

By way of example, the signal scaler 614 may be implemented using capacitors $C_{S\_1}$ and $C_{S\_2}$, where the capacitance ratio of the capacitors $C_{S\_1}$ and $C_{S\_2}$ defines the scaling factor $\beta$. Compared to $g_m$, the value of $g_m'$ can be increased due to the scaling factor $\beta$ as shown in equation (6). In this way, the noise cancellation condition is satisfied with the dominant noise factor from the transconductance stage effectively reduced, thus improving the NF correspondingly.

Figure 8:
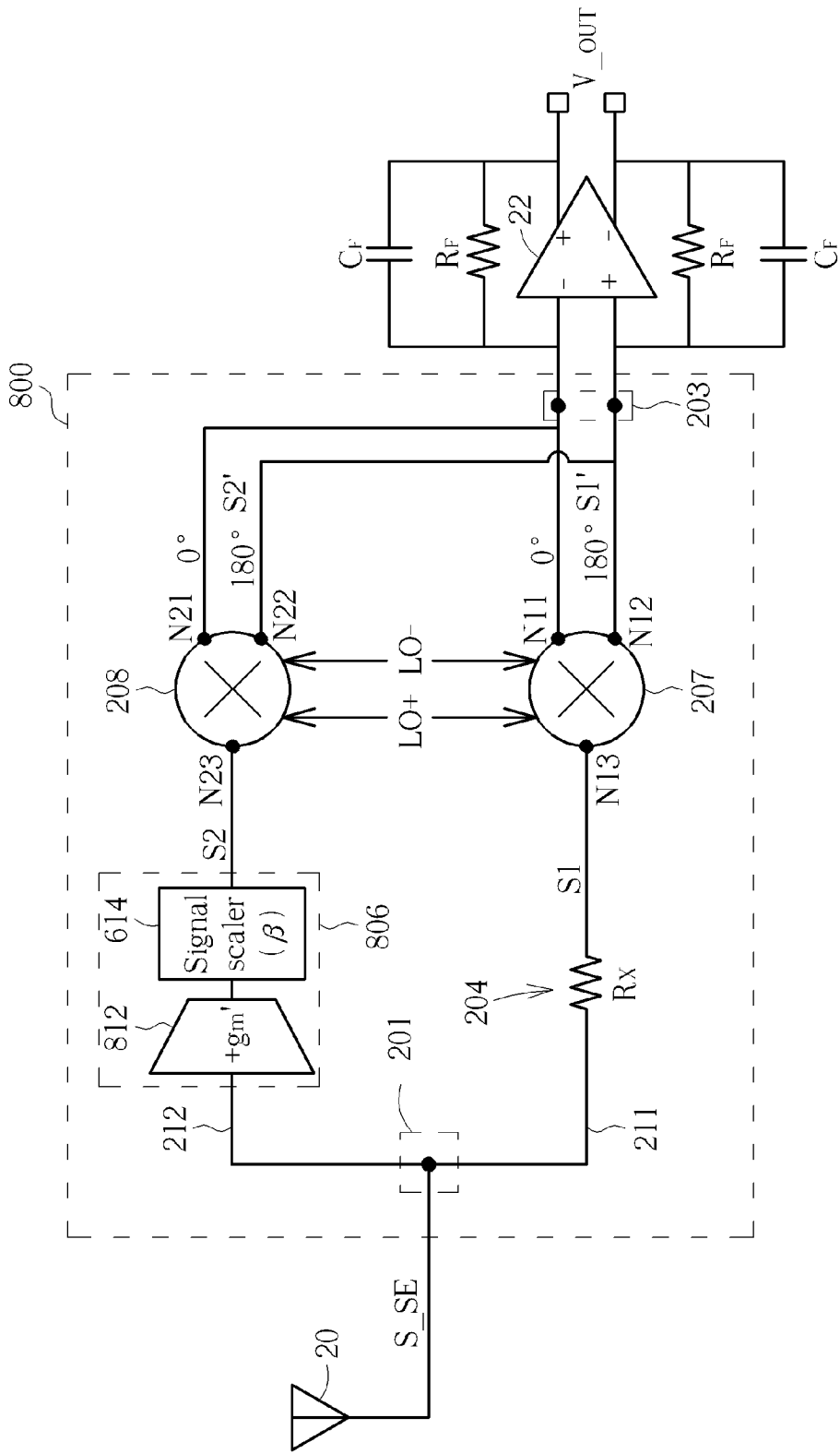
FIG. 8 is a diagram illustrating a signal processing circuit with single-ended topology according to a fourth embodiment of the present invention.

Please refer to FIG. 8, which is a diagram illustrating a signal processing circuit with single-ended topology according to a fourth embodiment of the present invention. The major difference between the signal processing circuits 500 and 800 is that the transconductance unit 812 in the transconductance stage 806 has a positive transconductance value $g_m$. However, a product of the input impedance $R_S$ viewed from the signal input port 201 and the transconductance magnitude $G_m$ (i.e., $Gm=\beta\times g_m$) of the transconductance stage 806 is still equal to one. Similarly, the noise cancellation condition is satisfied with the dominant noise factor from the transconductance stage effectively reduced, thus improving the NF correspondingly.

Figure 9:
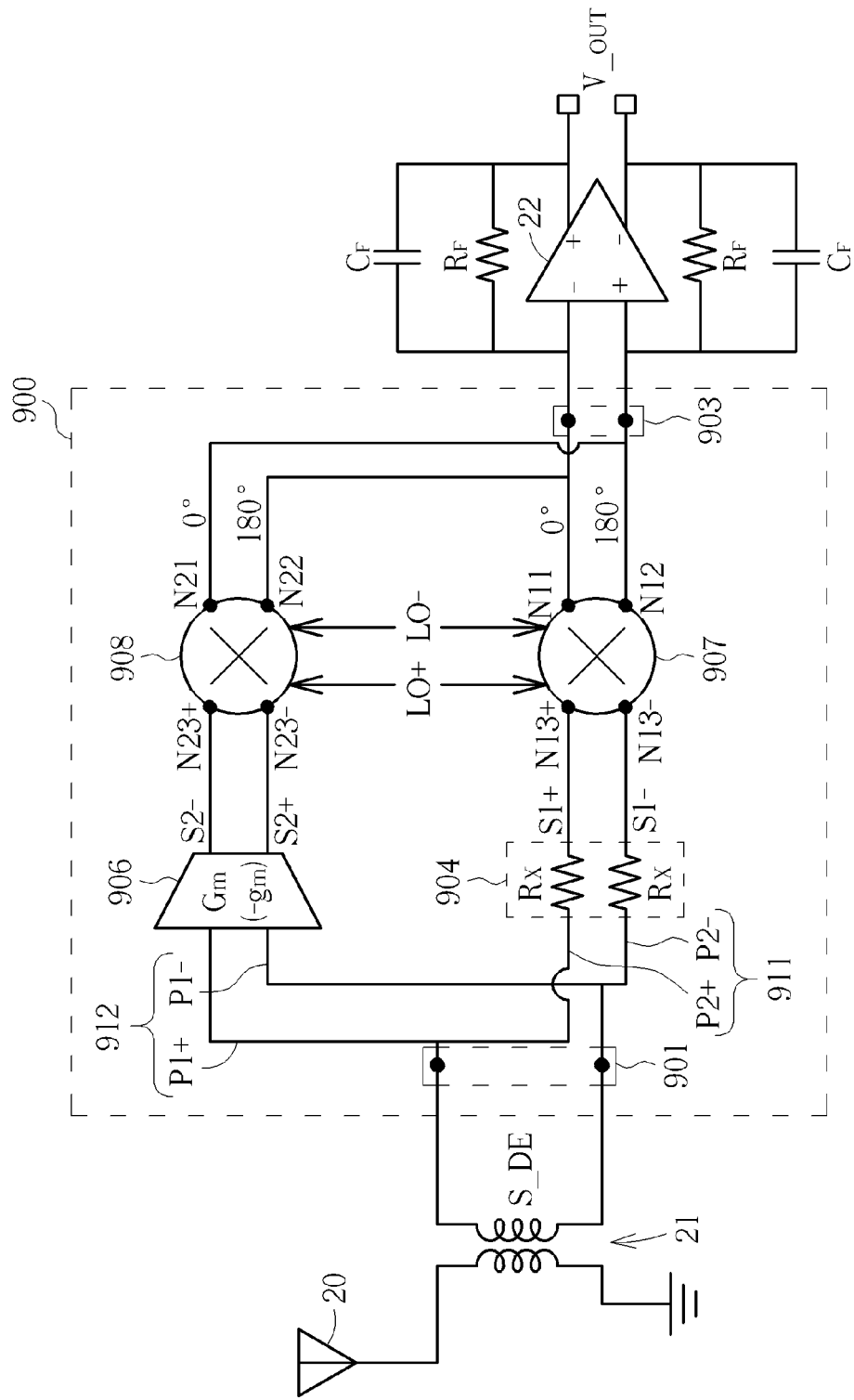
FIG. 9 is a diagram illustrating a signal processing circuit with differential topology according to a first embodiment of the present invention.

Regarding each of the aforementioned signal processing circuits 200, 500, 600, 800, single-ended topology is employed for processing the single-ended signal S_SE generated from the antenna 20. However, the same noise cancellation concept may be employed in a signal processing circuit with differential topology. FIG. 9 is a diagram illustrating a signal processing circuit with differential topology according to a first embodiment of the present invention. The signal processing circuit 900 is part of a frontend of a wireless receiver. Specifically, the receiver frontend may include the signal processing circuit 900 and the differential transimpedance amplifier 22. Hence, a signal output port 903 is coupled to the following differential transimpedance amplifier 22. As shown in FIG. 9, a signal input port 901 is coupled to the preceding antenna 20 through a transformer-based device (e.g., a balun) 21. Hence, a differential signal S_DE is received by the signal input port 901. In this embodiment, the signal processing circuit 900 includes an impedance matching unit 904, a transconductance stage 906, a first passive mixer 907, and a second passive mixer 908, where the impedance matching unit 904 and the first passive mixer 907 are both disposed at a first path (e.g., a main path) 911 including a positive signal trace P2+ and a negative signal trace P2−; and the transconductance stage 906 and the second passive mixer 908 are both disposed at a second path (e.g., an auxiliary path) 912 including a positive signal trace P1+ and a negative signal trace P1−. As can be seen from FIG. 9, the first path 911 is coupled between the signal input port 901 and the signal output port 903, and the second 912 path is also coupled between the signal input port 901 and the signal output port 903. In other words, the positive signal trace P1+ and the positive signal trace P2+ are connected in parallel, and the negative signal trace P1− and the negative signal trace P2− are connected in parallel.

In this embodiment, the differential signal S_DE is received at the signal input port 901, and processed by the impedance matching unit 904 and the transconductance stage 906, respectively. Specifically, the impedance matching unit 904 is arranged to provide input impedance matching. Besides, the impedance matching unit 904 is a bilateral element. For instance, the impedance matching unit 904 may be implemented using a first resistor and a second resistor each having the resistance value $R_X$. Regarding the transconductance stage 906 disposed at the second path 912, it is capable of guiding circuit introduced noise to the signal output port 903 for noise cancellation at the signal output port 903.

Figure 10:
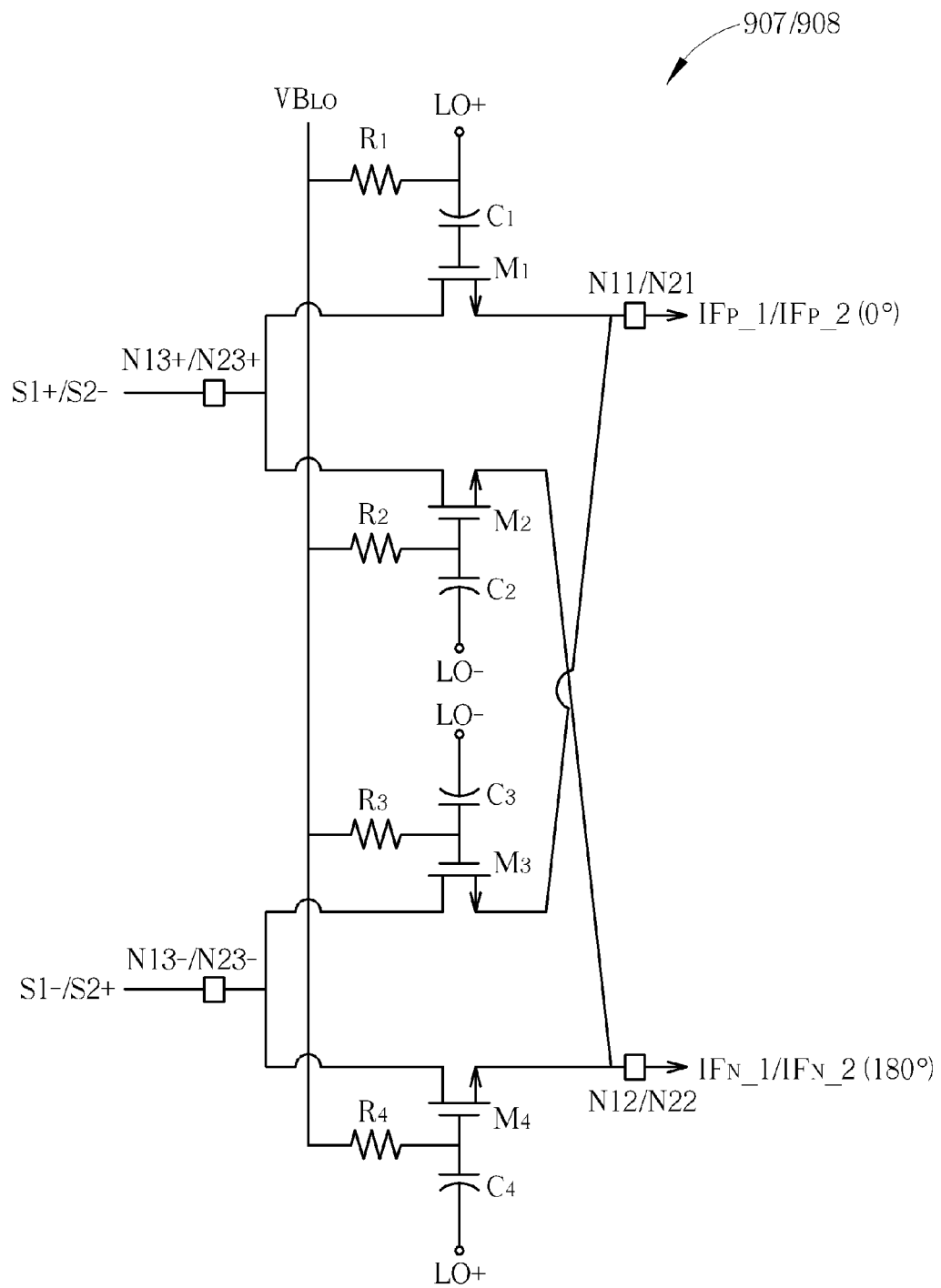
FIG. 10 is a circuit diagram illustrating an exemplary implementation of each of the first passive mixer and the second passive mixer shown in FIG. 9 according to the present invention.

The first passive mixer 907 is arranged to mix a positive signal S1+ and a negative signal S1− of an output of the impedance matching unit 904 with an LO output including a first LO signal LO+ and a second LO signal LO− having a 180-degree phase difference therebetween. The second passive mixer 908 is arranged to mix a positive signal S2+ and a negative signal S2− of an output of the transconductance stage 906 with the LO output. Please refer to FIG. 10, which is a circuit diagram illustrating an exemplary implementation of each of the first passive mixer 907 and the second passive mixer 908 according to the present invention. As shown in FIG. 10, the passive mixer 907/908 includes a plurality of resistors $R_1$, $R_2$, $R_3$, $R_4$, a plurality of capacitors $C_1$, $C_2$, $C_3$, $C_4$ and a plurality of transistors $M_1$, $M_2$, $M_3$, $M_4$. Besides, the transistors $M_1$-$M_4$ are biased by $VB_{LO}$; a first output node N11/N21 of the passive mixer 907/908 is coupled to the transistors $M_1$ and $M_3$; and a second output node N12/N22 of the passive mixer 907/908 is coupled to the transistors $M_2$ and $M_4$. As a result, a positive signal $IF_{P\_1}$ and a negative signal $IF_{N\_1}$ of a first differential mixer output S1' is generated from a first output node N11 and a second output node N12 of the first passive mixer 907 according to the positive signal S1+ received at an input node N13+ and the negative signal S1− received at an input node N13−; similarly, a positive signal $IF_{P\_2}$ and a negative signal $IF_{N\_2}$ of a second differential mixer output S2' is generated from a first output node N21 and a second output node N22 of the second passive mixer 908 according to the positive signal S2+ received at an input node N23− and the negative signal S2− received at an input node N23+. Preferably, an additional capacitor (not shown) may be coupled between the first output node N11/N21 and the second output node N12/N22. When the capacitance value of the additional capacitor is increased, the effective quality factor (Q) is increased, which means better output blocker rejection.

It should be noted that the first passive mixer 907 and the impedance matching unit 904 are bilateral elements. Hence, when the aforementioned noise cancellation condition (e.g., $G_m*R_s=G_m*(R_x+R_{IN})=1$) is satisfied, the circuit introduced noise of the internal circuit elements (e.g., impedance matching unit 904, first passive mixer 907 and differential transimpedance amplifier 22) may be transmitted via the second path 912 to reach the signal output port 903, and then combined with the circuit introduced noise originally present at the signal output port 903 for noise cancellation. As a person skilled in the art can readily understand operation of the signal processing circuit 900 after reading above paragraphs directed to the signal processing circuit 200 shown in FIG. 2, further description is omitted here for brevity.

Figure 11:
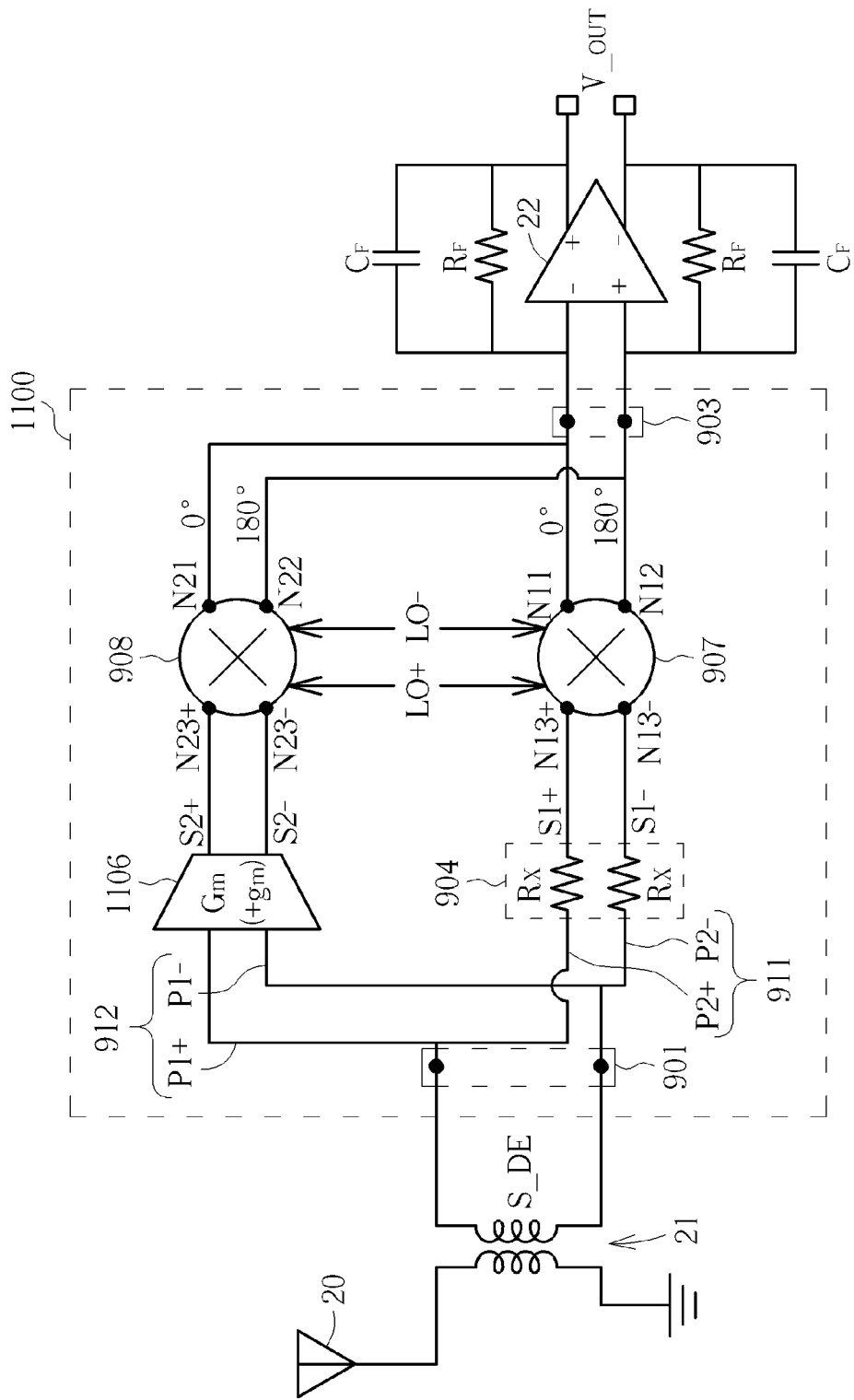
FIG. 11 is a diagram illustrating a signal processing circuit with differential topology according to a second embodiment of the present invention.
Figure 12:
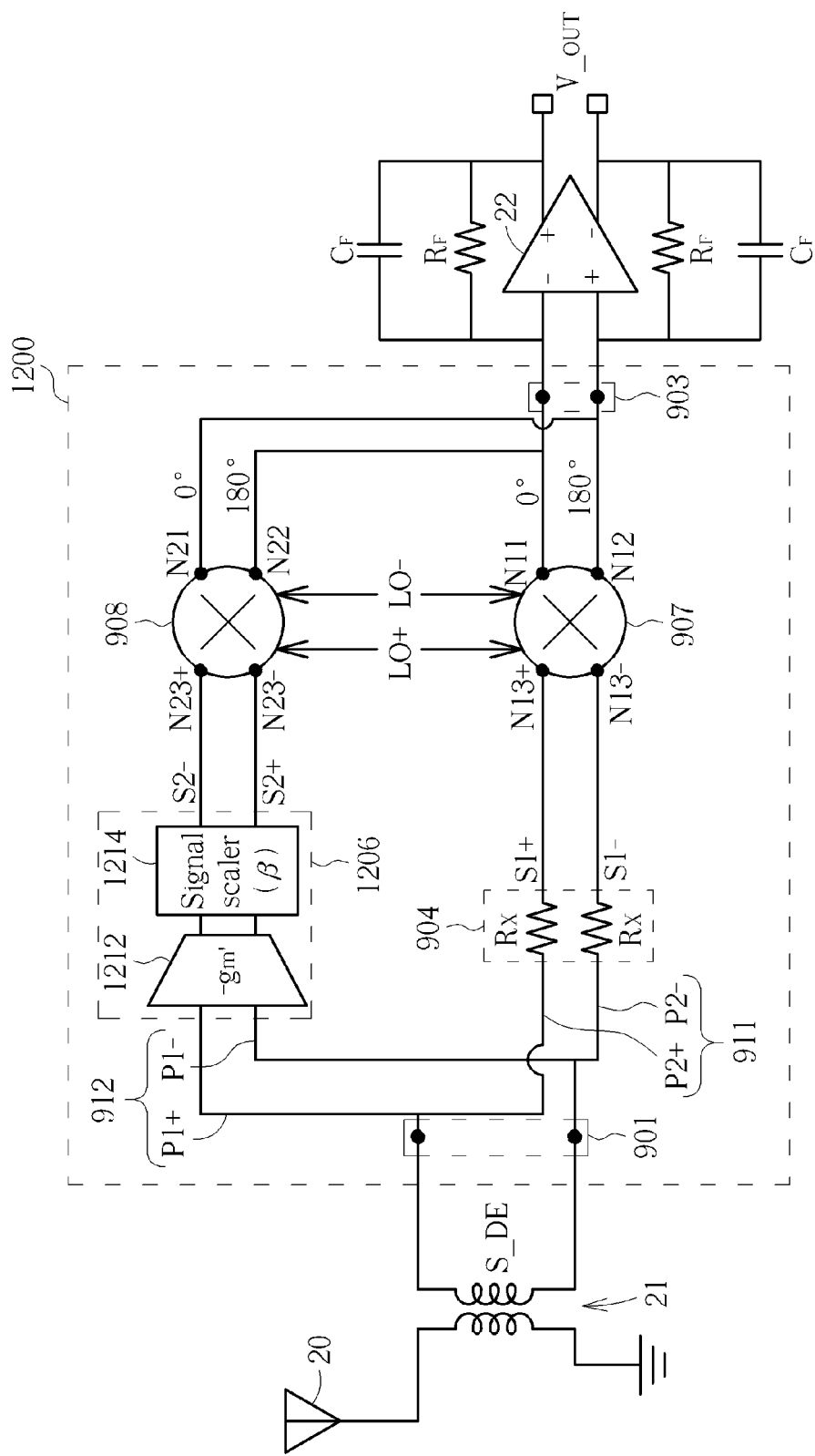
FIG. 12 is a diagram illustrating a signal processing circuit with differential topology according to a third embodiment of the present invention.
Figure 13:
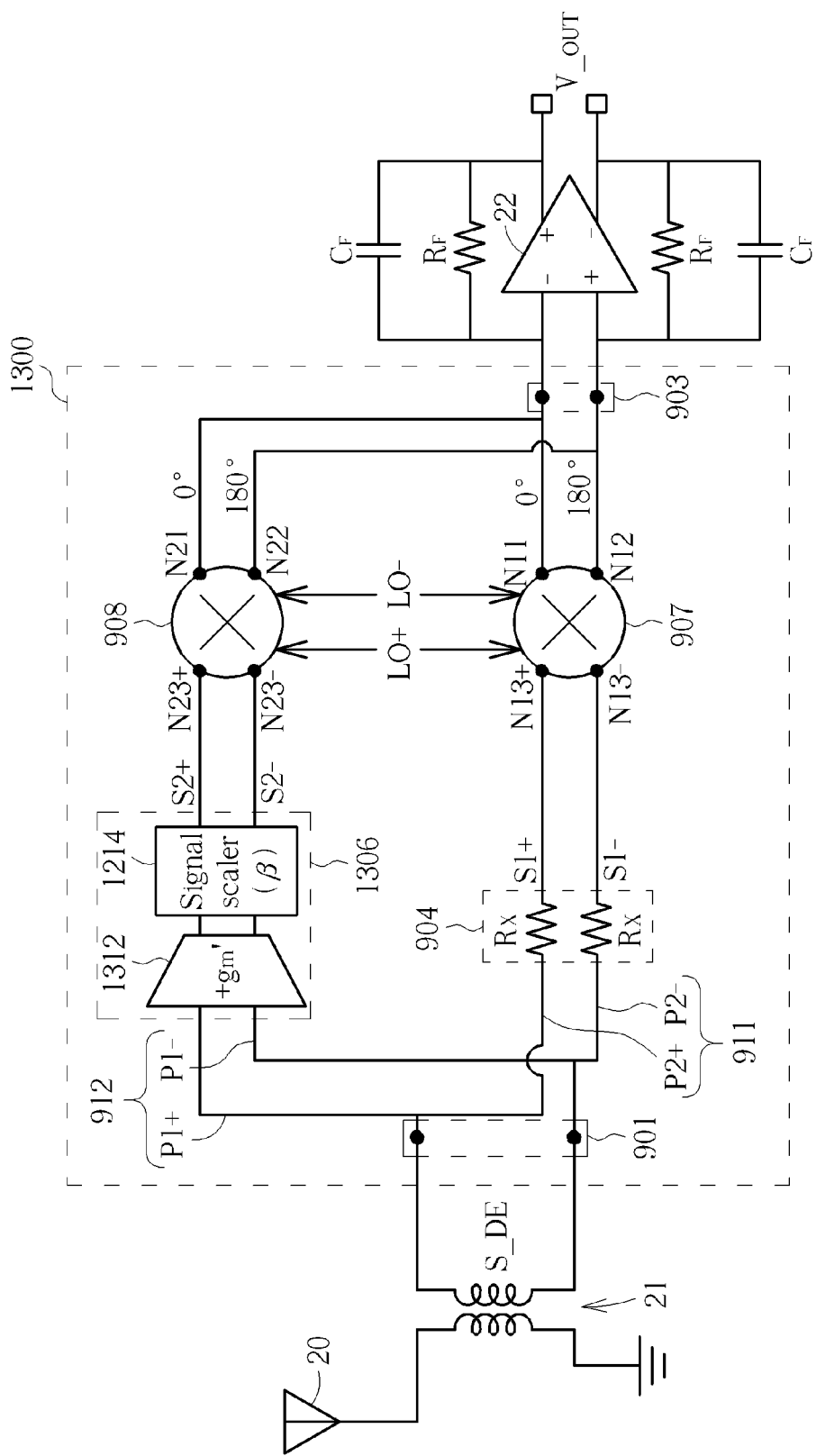
FIG. 13 is a diagram illustrating a signal processing circuit with differential topology according to a fourth embodiment of the present invention.

Similarly, each of the signal processing circuits 500, 600, 800 may be modified to process a differential input. FIG. 11 is a diagram illustrating a signal processing circuit with differential topology according to a second embodiment of the present invention. FIG. 12 is a diagram illustrating a signal processing circuit with differential topology according to a third embodiment of the present invention. FIG. 13 is a diagram illustrating a signal processing circuit with differential topology according to a fourth embodiment of the present invention. The major difference between the signal processing circuits 900 and 1100 is that the transconductance stage 1106 has a positive transconductance value $g_m$, and the first output node N11 of the first passive mixer 907 is coupled to the first output node N21 of the second passive mixer 908 and the second output node N12 of the first passive mixer 907 is coupled to the second output node N22 of the second passive mixer 908. The major difference between the signal processing circuits 900 and 1200 is that the transconductance stage 1206 includes a transconductance unit 1212 and a signal scaler 1214, where the transconductance unit 1212 has a negative transconductance value $-g_m'$, and the signal scaler 1214 may be implemented using capacitors and has a noiseless scaling factor $\beta$ applied to a differential output of the preceding transconductance unit 1212. The major difference between the signal processing circuits 1100 and 1300 is that the transconductance stage 1306 includes a transconductance unit 1312 and the aforementioned signal scaler 1214, wherein the transconductance unit 1312 has a positive transconductance value $g_m'$. As a person skilled in the art can readily understand operations of the signal processing circuits 1100-1300 after reading above paragraphs, further description is omitted here for brevity.

It should be noted that aforementioned signal processing circuits are for illustrative purposes only, and are not meant to be limitations of the present invention. That is, modifications made to the signal processing circuits mentioned above are feasible as long as the noise cancellation condition is satisfied. Several alternative circuit designs are therefore provided as below.

Figure 14:
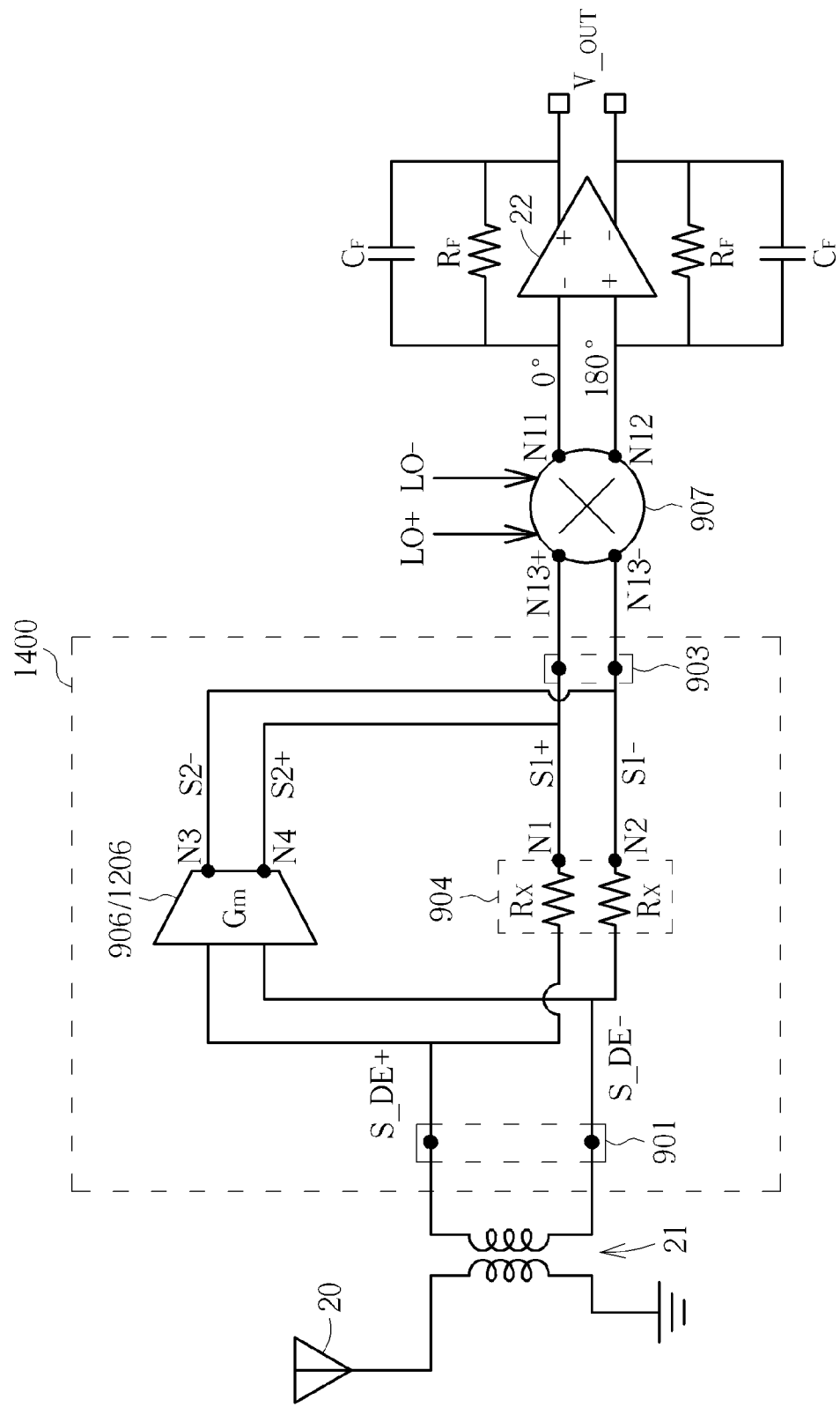
FIG. 14 is a diagram illustrating a signal processing circuit with differential topology according to a fifth embodiment of the present invention.

FIG. 14 is a diagram illustrating a signal processing circuit with differential topology according to a fifth embodiment of the present invention. The signal processing circuit 1400 includes the aforementioned impedance matching unit 904 and transconductance stage 906/1206 disposed at different paths. In this embodiment, the signal output port 903 is coupled to a passive mixer (e.g., the aforementioned first passive mixer 907), and provides an output signal (e.g., a noise-cancelled current output) to the passive mixer for down-conversion. As shown in FIG. 14, the differential mixer output of the passive mixer is processed by the differential transimpedance amplifier 22, and a voltage output $V\_{OUT}$ corresponding to a differential signal received at the signal input port 901 is generated from the differential transimpedance amplifier 22. The differential signal received at the signal input port 901 includes a positive signal S_DE+ and a negative signal S_DE−, and is processed by the impedance matching unit 904 and the transconductance stage 906/1206, respectively. The impedance matching unit 904 has a first output node N1 responsive to the positive signal S_DE+ and a second output node N2 responsive to the negative signal S_DE−. The transconductance stage 906/1206 has a third output node N3 responsive to the positive signal S_DE+ and a fourth output node N4 responsive to the negative signal S_DE−. It should be noted that the transconductance stage 906/1206 has a negative transconductance value. Specifically, when the transconductance stage 906 is employed, $G_m=|-g_m|$; and when the transconductance stage 1206 is employed, $G_m=\beta \times |-g_m'|$. To make the circuit induced noise properly cancelled at the signal output port 903, the connections of output nodes of the impedance matching unit 904 and the transconductance stage 906/1206 should be properly set. Hence, the first output node N1 is coupled to the fourth output node N4, and the second output node N2 is coupled to the third output node N3.

Figure 15:
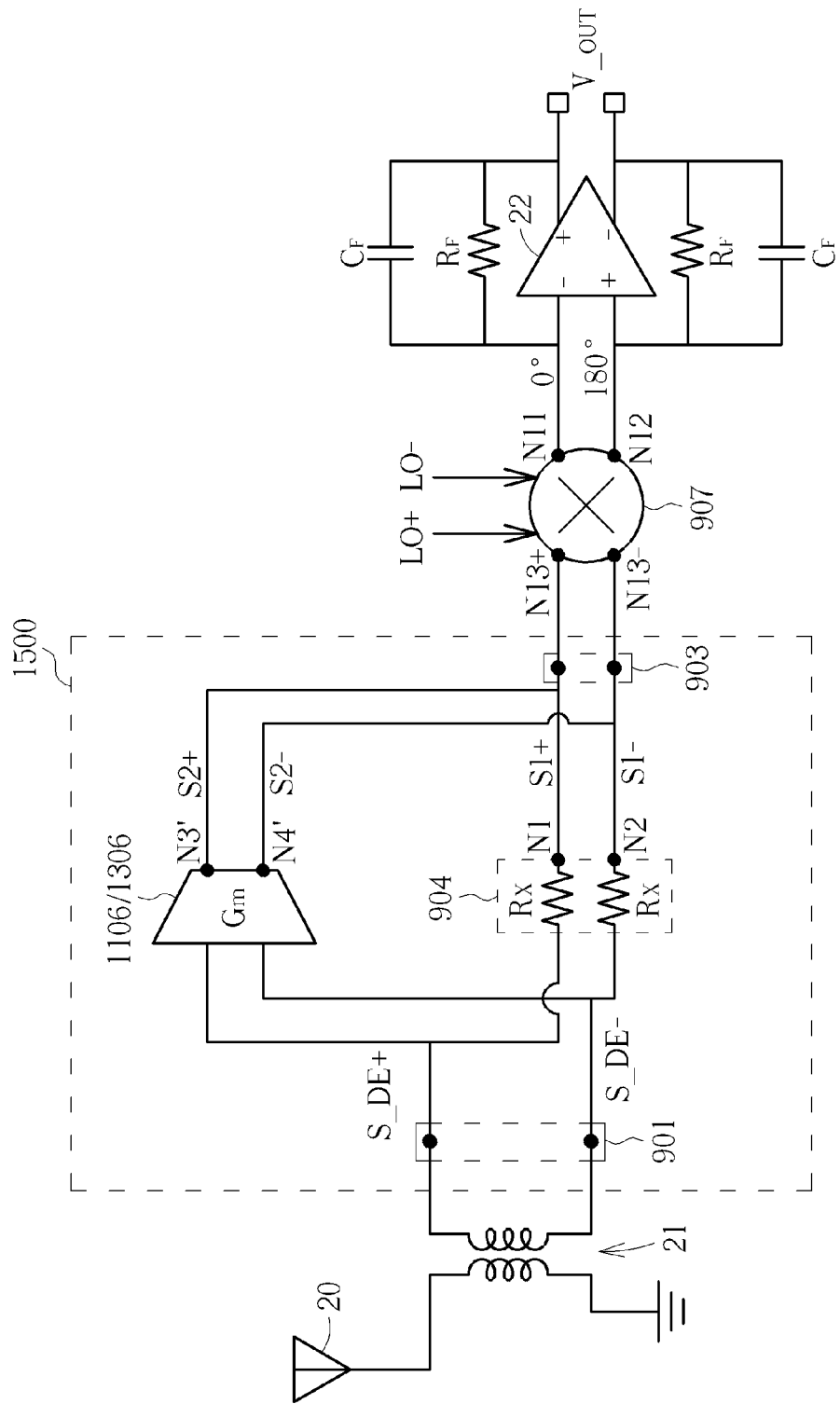
FIG. 15 is a diagram illustrating a signal processing circuit with differential topology according to a sixth embodiment of the present invention.

FIG. 15 is a diagram illustrating a signal processing circuit with differential topology according to a sixth embodiment of the present invention. The signal processing circuit 1500 includes the aforementioned impedance matching unit 904 and transconductance stage 1106/1306. Regarding the transconductance stage 1106/1306, it has a third output node N3' responsive to the positive signal S_DE+ and a fourth output node N4' responsive to the negative signal S_DE−. It should be noted that the transconductance stage 1106/1306 has a positive transconductance value. Specifically, when the transconductance stage 1106 is employed, $G_m=g_m$; and when the transconductance stage 1306 is employed, $G_m=\beta \times g_m'$. To make the circuit induced noise properly cancelled at the signal output port 903, the connections of output nodes of the impedance matching unit 904 and the transconductance stage 1106/1306 should be properly set. Hence, the first output node N1 is coupled to the third output node N3', and the second output node N2 is coupled to the fourth output node N4'.

Figure 16:
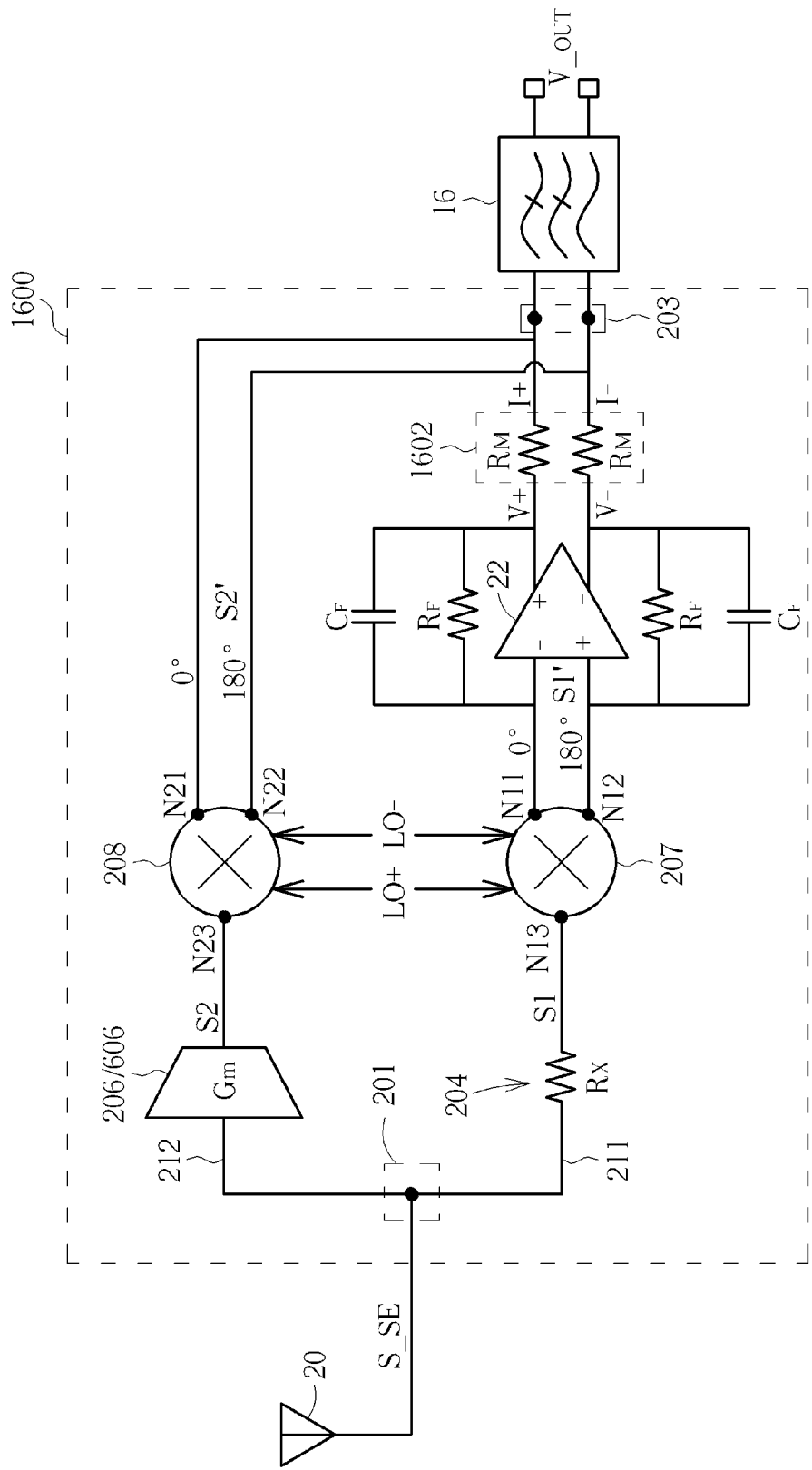
FIG. 16 is a diagram illustrating a signal processing circuit with single-ended topology according to a fifth embodiment of the present invention.

FIG. 16 is a diagram illustrating a signal processing circuit with single-ended topology according to a fifth embodiment of the present invention. The signal processing circuit 1600 includes the aforementioned impedance matching unit 204, transconductance stage 206/606, first passive mixer 207, second passive mixer 208, and differential transimpedance amplifier 22, and further includes a voltage-to-current converting unit 1602. In this embodiment, the voltage-to-current converting unit 1602 is implemented using resistors each having a resistance value $R_M$. The differential transimpedance amplifier 22 is disposed at the first path 211, and arranged for generating a first voltage output V+ corresponding to the positive signal (e.g., $IF_P\_1$ shown in FIG. 3) of the first differential mixer output S1', and generating a second voltage output V− corresponding to the negative signal (e.g., $IF_N\_1$ shown in FIG. 3) of the first differential mixer output S1'. The voltage-to-current converting unit 1602 is also disposed at the first path 211, and arranged for converting the first voltage output V+ into a first current output I+, and converting the second voltage output V− into a second current output I−. The output of the voltage-to-current converting unit 1602 is then combined with the second differential mixer output S2'. As shown in FIG. 16, the signal output port 203 is coupled to a filter (e.g., a low-pass filter) 16, and a voltage output $V_{OUT}$ is generated from the filter 16 according to a noise-cancelled current output of the signal processing circuit 1600. It should be noted that the transconductance stage 206/606 has a negative transconductance value. Specifically, when the transconductance stage 206 is employed, $G_m=|-g_m|$; and when the transconductance stage 606 is employed, $G_m=\beta\times|-g_m'|$. Besides, the transimpedance amplifier 22 has a negative gain. To make the circuit induced noise properly cancelled at the signal output port 203, the connection of the voltage-to-current converting unit 1602 and the second passive mixer 208 should be properly set. As shown in FIG. 16, the first output node N11 of the first passive mixer 207 is coupled to the first output node N21 of the second passive mixer 208 through the differential transimpedance amplifier 22 and the voltage-to-current converting unit 1602, and the second output node N12 of the first passive mixer 207 is coupled to the second output node N22 of the second passive mixer 208 through the differential transimpedance amplifier 22 and the voltage-to-current converting unit 1602. It should be noted that the first passive mixer 207 is a bilateral element; however, the differential transimpedance amplifier 22 is not a bilateral element, and only allows for one-directional signal transmission. Therefore, the circuit induced noise of the differential transimpedance amplifier 22 can be cancelled by the signal processing circuit 1600, but the circuit induced noise of the filter 16 cannot be cancelled by the signal processing circuit 1600.

Figure 17:
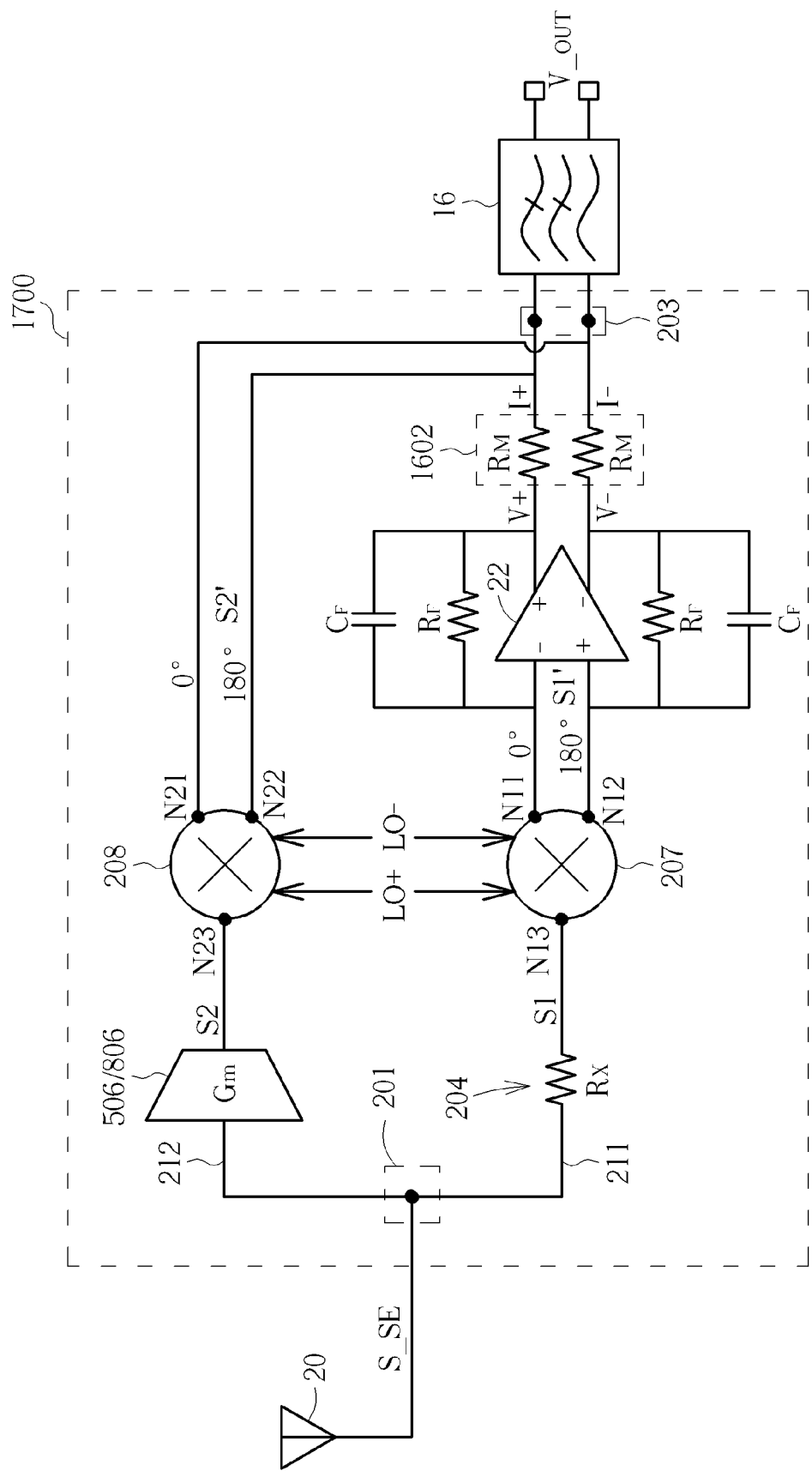
FIG. 17 is a diagram illustrating a signal processing circuit with single-ended topology according to a sixth embodiment of the present invention.

FIG. 17 is a diagram illustrating a signal processing circuit with single-ended topology according to a sixth embodiment of the present invention. The signal processing circuit 1700 includes the aforementioned impedance matching unit 204, transconductance stage 506/806, first passive mixer 207, second passive mixer 208, differential transimpedance amplifier 22, and voltage-to-current converting unit 1602. It should be noted that the transconductance stage 506/806 has a positive transconductance value. Specifically, when the transconductance stage 506 is employed, $G_m=g_m$; and when the transconductance stage 806 is employed, $G_m=\beta\times g_m'$. Besides, as mentioned above, the transimpedance amplifier 22 has a negative gain. To make the circuit induced noise properly cancelled at the signal output port 203, the first output node N11 of the first passive mixer 207 is coupled to the second output node N22 of the second passive mixer 208 through the differential transimpedance amplifier 22 and the voltage-to-current converting unit 1602, and the second output node N12 of the first passive mixer 207 is coupled to the first output node N21 of the second passive mixer 208 through the differential transimpedance amplifier 22 and the voltage-to-current converting unit 1602.

Figure 18:
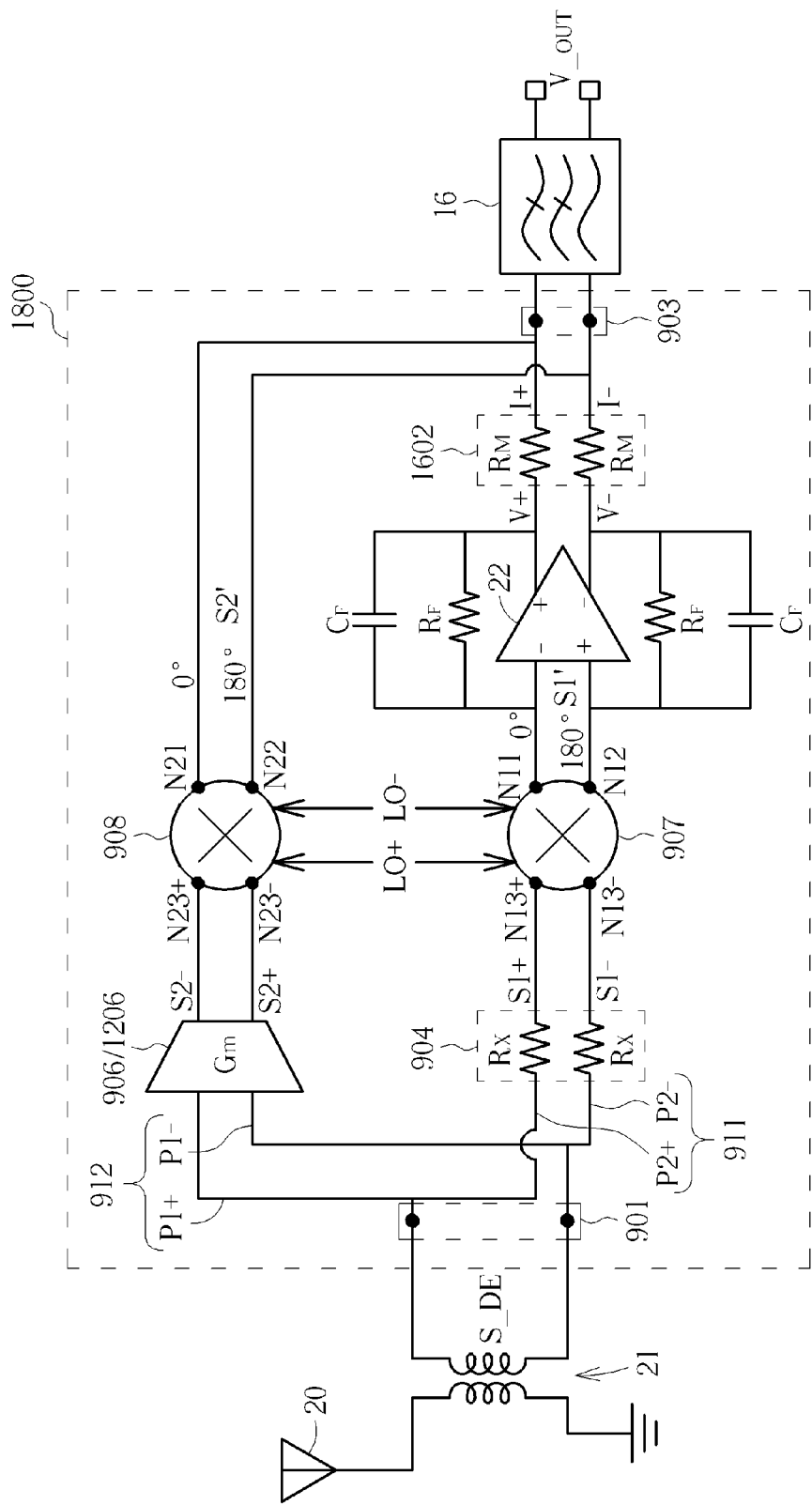
FIG. 18 is a diagram illustrating a signal processing circuit with differential topology according to a seventh embodiment of the present invention.

FIG. 18 is a diagram illustrating a signal processing circuit with differential topology according to a seventh embodiment of the present invention. The signal processing circuit 1800 includes the aforementioned impedance matching unit 904, transconductance stage 906/1206, first passive mixer 907, second passive mixer 908, differential transimpedance amplifier 22, and voltage-to-current converting unit 1602. In this embodiment, the differential transimpedance amplifier 22 is disposed at the first path 911, and arranged for generating a first voltage output V+ corresponding to the positive signal (e.g., $IF_{P\_1}$ shown in FIG. 10) of the first differential mixer output S1', and generating a second voltage output V− corresponding to the negative signal (e.g., $IF_{N\_1}$ shown in FIG. 10) of the first differential mixer output S1'. It should be noted that the transconductance stage 906/1206 has a negative transconductance value. Specifically, when the transconductance stage 906 is employed, $G_m=|-g_m|$; and when the transconductance stage 1206 is employed, $G_m=\beta\times|-g_m'|$. Besides, as mentioned above, the transimpedance amplifier 22 has a negative gain. To make the circuit induced noise properly cancelled at the signal output port 903, the first output node N11 of the first passive mixer 907 is coupled to the first output node N21 of the second passive mixer 908 through the differential transimpedance amplifier 22 and the voltage-to-current converting unit 1602, and the second output node N12 of the first passive mixer 907 is coupled to the second output node N22 of the second passive mixer 908 through the differential transimpedance amplifier 22 and the voltage-to-current converting unit 1602. As the first passive mixer 207 is a bilateral element and the differential transimpedance amplifier 22 is not a bilateral element, the circuit induced noise of the differential transimpedance amplifier 22 can be cancelled by the signal processing circuit 1800, but the circuit induced noise of the filter 16 cannot be cancelled by the signal processing circuit 1800.

Figure 19:
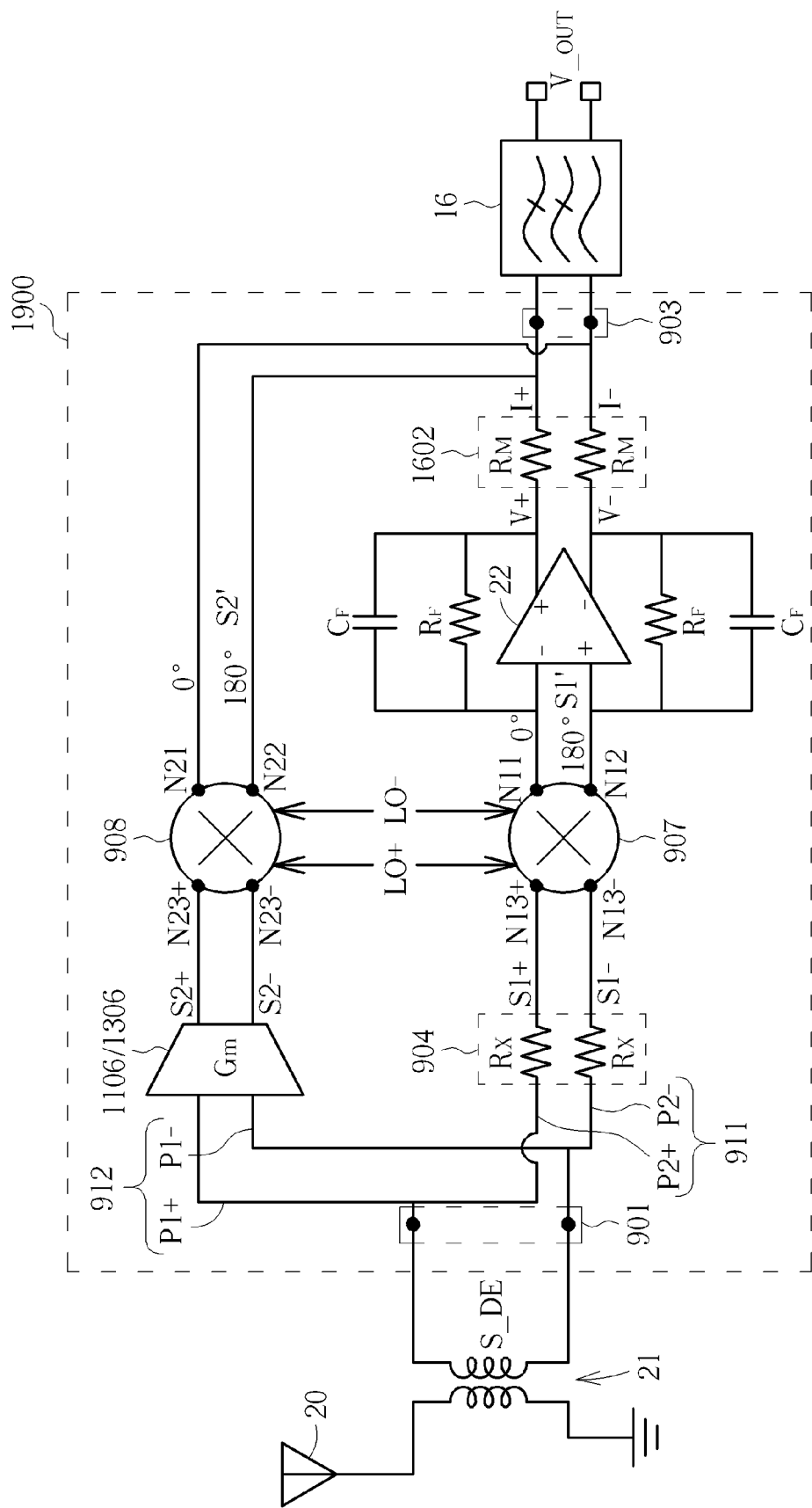
FIG. 19 is a diagram illustrating a signal processing circuit with differential topology according to an eighth embodiment of the present invention.
Figure 20:
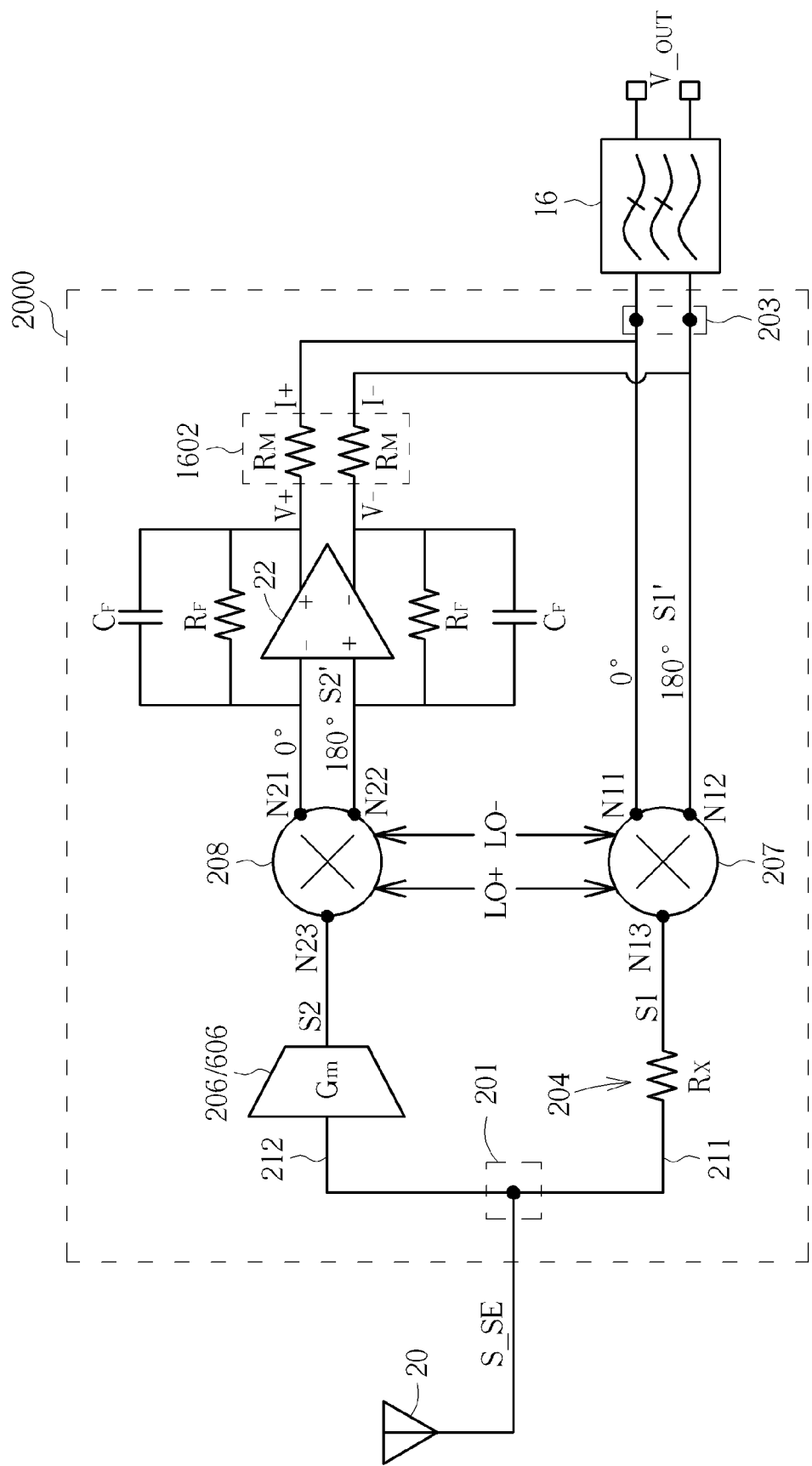
FIG. 20 is a diagram illustrating a signal processing circuit with single-ended topology according to a seventh embodiment of the present invention.
Figure 21:
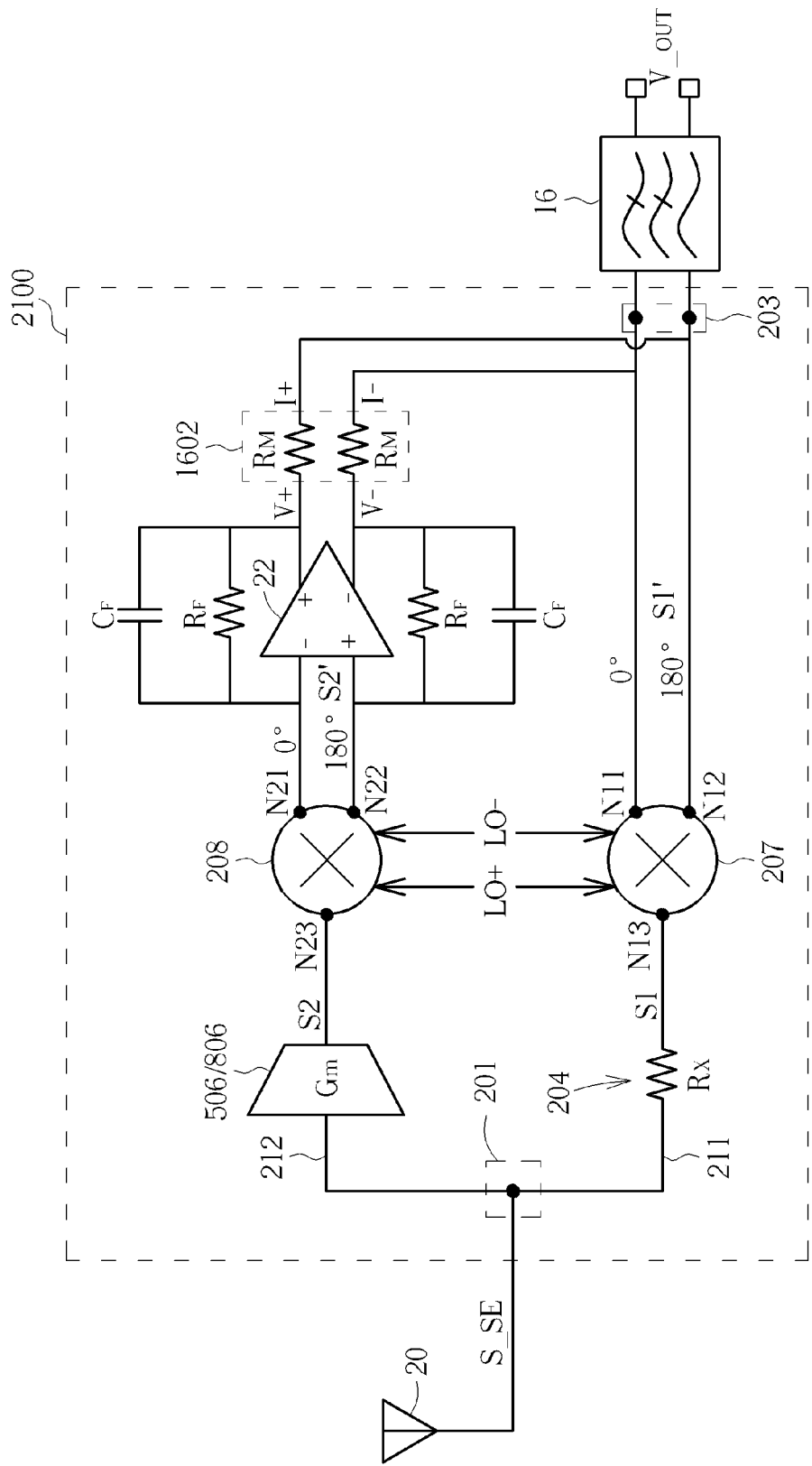
FIG. 21 is a diagram illustrating a signal processing circuit with single-ended topology according to an eighth embodiment of the present invention.
Figure 22:
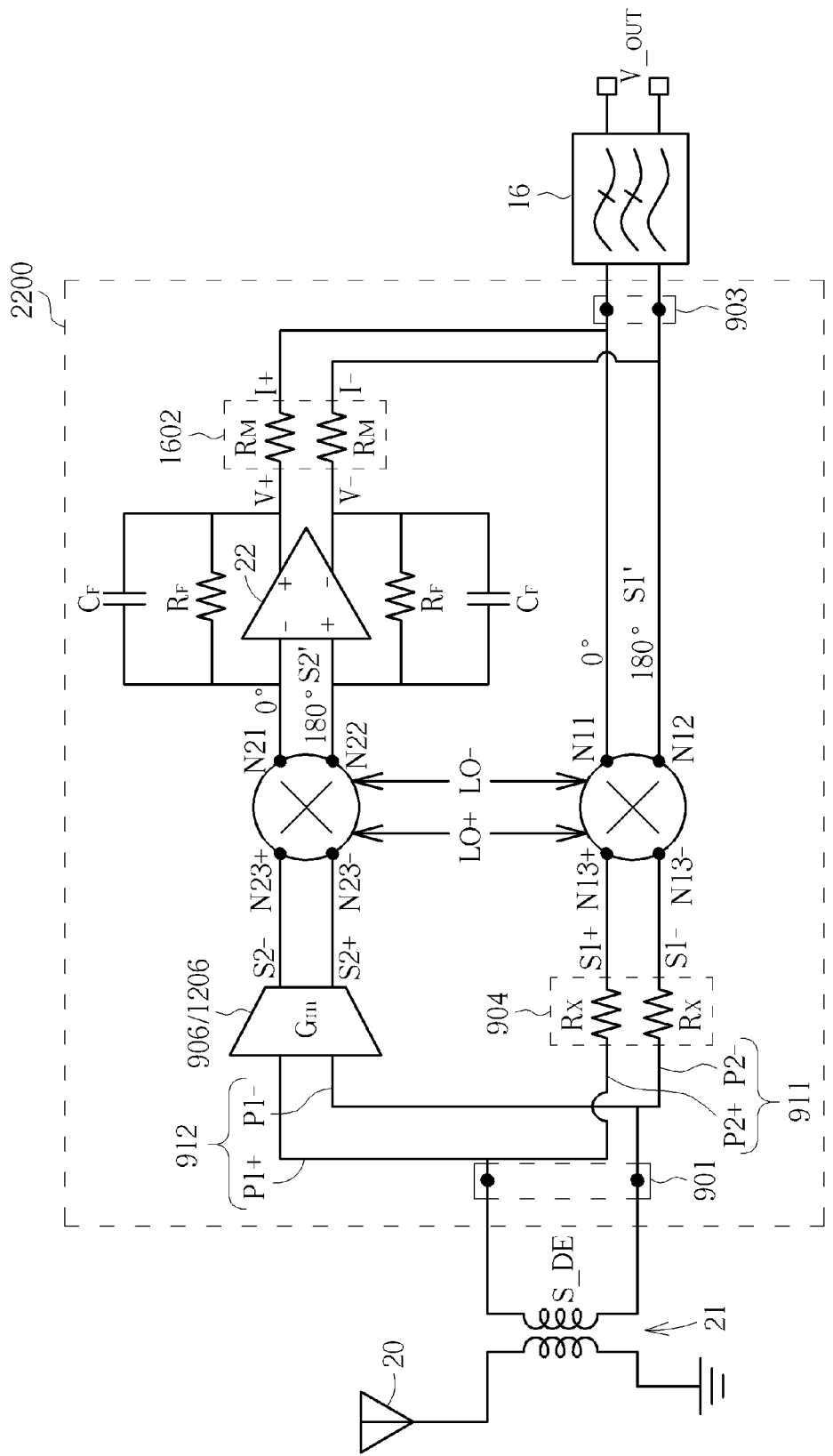
FIG. 22 is a diagram illustrating a signal processing circuit with differential topology according to a ninth embodiment of the present invention.
Figure 23:
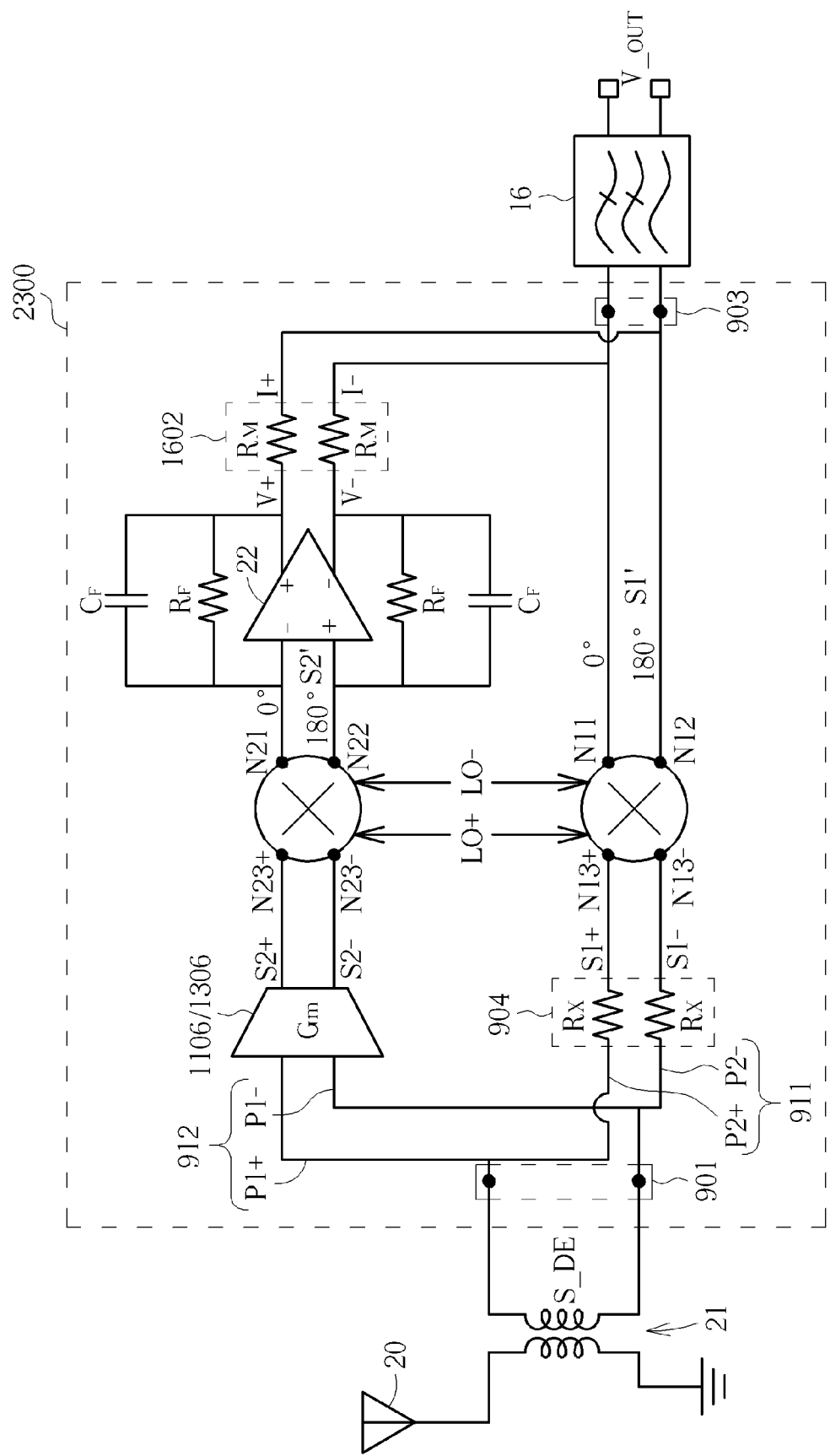
FIG. 23 is a diagram illustrating a signal processing circuit with differential topology according to a tenth embodiment of the present invention.

FIG. 19 is a diagram illustrating a signal processing circuit with differential topology according to an eighth embodiment of the present invention. The signal processing circuit 1900 includes the aforementioned impedance matching unit 904, transconductance stage 1106/1306, first passive mixer 907, second passive mixer 908, differential transimpedance amplifier 22, and voltage-to-current converting unit 1602. It should be noted that the transconductance stage 1106/1306 has a positive transconductance value. Specifically, when the transconductance stage 1106 is employed, $G_m=g_m$; and when the transconductance stage 1306 is employed, $G_m=\beta\times g_m'$. Besides, as mentioned above, the transimpedance amplifier 22 has a negative gain. To make the circuit induced noise properly cancelled at the signal output port 903, the first output node N11 of the first passive mixer 907 is coupled to the second output node N22 of the second passive mixer 908 through the differential transimpedance amplifier 22 and the voltage-to-current converting unit 1602, and the second output node N12 of the first passive mixer 907 is coupled to the first output node N21 of the second passive mixer 908 through the differential transimpedance amplifier 22 and the voltage-to-current converting unit 1602.

In above examples shown in FIGS. 16-19, the differential transimpedance amplifier 22 and the voltage-to-current converting unit 1602 are both disposed at the first path 211/911. However, this is not meant to be a limitation of the present invention. Please refer to FIGS. 20-23, which illustrate a signal processing circuit with single-ended topology according to a seventh embodiment of the present invention, a signal processing circuit with single-ended topology according to an eighth embodiment of the present invention, a signal processing circuit with differential topology according to a ninth embodiment of the present invention, and a signal processing circuit with differential topology according to a tenth embodiment of the present invention, respectively. Regarding each of the signal processing circuits 2000, 2100, 2200, 2300, the differential transimpedance amplifier 22 and the voltage-to-current converting unit 1602 are disposed at the second path 212/912. As the first passive mixer 207/907 and the impedance matching unit 204/904 are bilateral elements, the circuit induced noise of the filter 16 can be cancelled by the signal processing circuit 2000/2100/2200/2300. However, as the transconductance stage disposed at the second path 212/912 is not a bilateral element, the circuit induced noise of the differential transimpedance amplifier 22 cannot be cancelled by the signal processing circuit 2000/2100/2200/2300.

As mentioned above, the proposed signal processing circuit is part of a frontend of a wireless receiver. By way of example, but not limitation, the wireless receiver may be a quadrature receiver. Please refer to FIG. 24, which is a diagram illustrating a signal processing circuit implemented in a quadrature receiver according to an embodiment of the present invention. The signal processing circuit 2400 is based on the signal processing circuit 200 shown in FIG. 2, and further includes a third passive mixer 2407 and a fourth passive mixer 2408. The LO output, including the first LO signal LO+ and the second LO signal LO−, is used for down-converting a radio-frequency (RF) input to extract an in-phase (I) component from the RF input. The other LO output, including a third LO signal LO'+ and a fourth LO signal LO'−, is used for down-converting the RF input to extract a quadrature (Q) component from the RF input. It should be noted that the first LO signal LO+ and the third LO signal LO'+ have a 90-degree phase difference therebetween, and the second LO signal LO− and the fourth LO signal LO'− have a 90-degree phase difference therebetween. Preferably, the first LO signal LO+, the third LO signal LO'+, the second LO signal LO− and the fourth LO signal LO'− are non-overlapping clocks. For example, each of the first LO signal LO+, the third LO signal LO'+, the second LO signal LO− and the fourth LO signal LO'− has a duty cycle not greater than 25%, thus improving the noise performance of the quadrature receiver. It should be noted that the passive mixers implemented in other signal processing circuit(s) (e.g., 200, 500, 600, 800, 900, 1100, 1200, 1300, 1400, 1500, 1600, 1700, 1800, 1900, 2000, 2100, 2200 and/or 2300) may also be driven by non-overlapping LO signals LO+ and LO− each having a duty cycle not greater than 25%, thus achieving improved noise performance.

Figure 24:
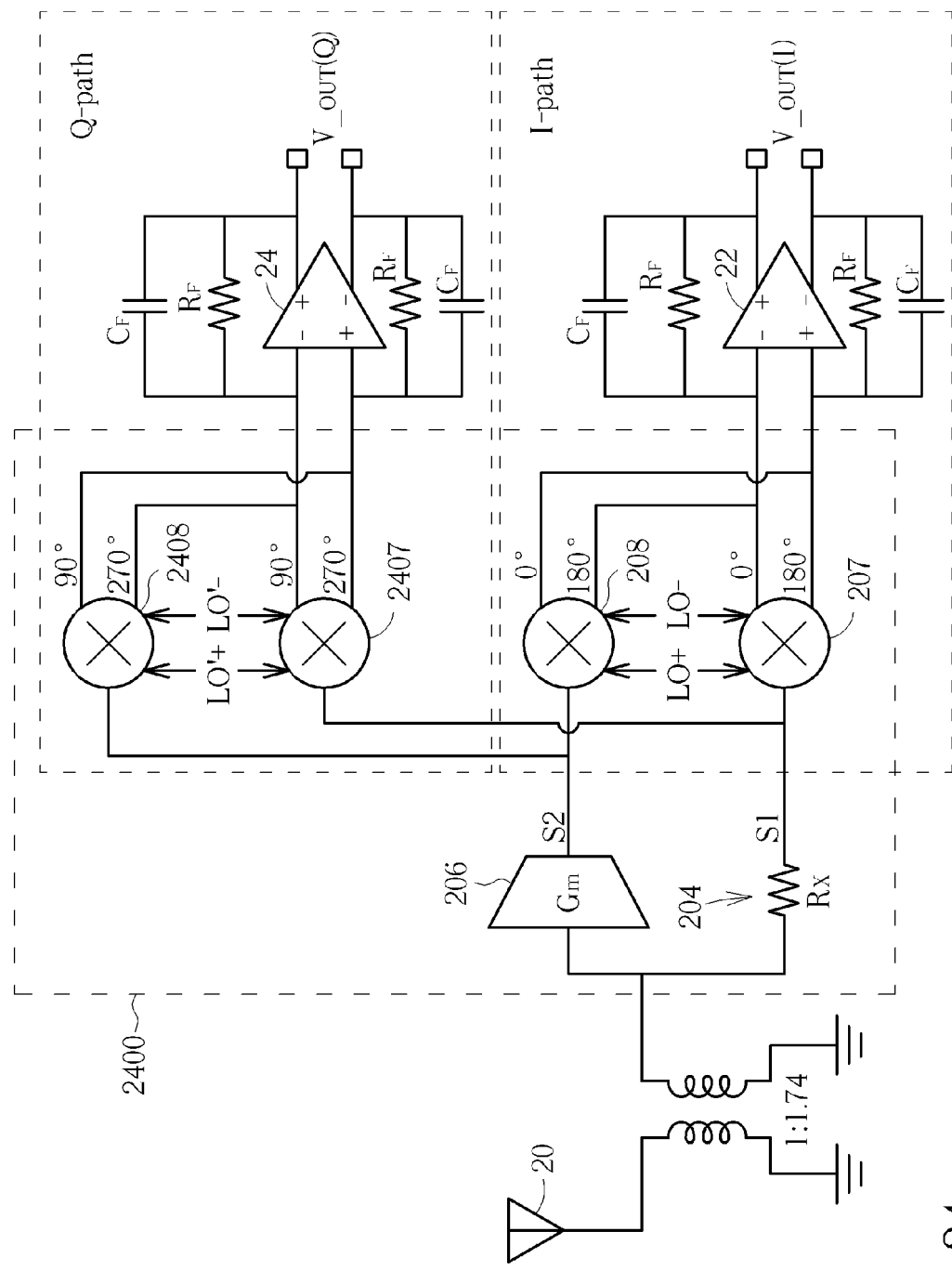
FIG. 24 is a diagram illustrating a signal processing circuit implemented in a quadrature receiver according to an embodiment of the present invention.

As shown in FIG. 24, the output S1 of the impedance matching unit 204 and the output S2 of the transconductance stage 206 are further transmitted to the third passive mixer 2407 and the fourth passive mixer 2408, respectively. The same noise cancellation concept applied to the I-path can be employed in the Q-path. Thus, the circuit induced noise of the differential transimpedance amplifier 24 and the third passive mixer 2407 can be cancelled at the Q-path when the required noise cancellation condition is satisfied. Besides the signal processing circuit 200 shown in FIG. 2, other signal processing circuits shown in FIGS. 5, 6, 8, 9 and 11-13 may be implemented in a quadrature receiver. As a person skilled in the art can readily understand operation of these signal processing circuits implemented in quadrature receivers after reading above paragraphs, further description is omitted for brevity.

The frontend using the proposed signal processing circuit may have different hardware configurations under different gain modes/settings. Take the frontend shown in FIG. 24 as an example. In a case where the signal received by the antenna 20 has a small signal level, the frontend would be operated in a high-gain (HG) mode. Hence, the transconductance stage 206, the second passive mixer 208 and the fourth passive mixer 2408 are enabled. When the input impedance is matched to 150Ω and the feedback resistor RF has a resistance value equal to 5.8KΩ, the voltage gain at the HG mode is equal to $$10^{(G_{matching}/20)} \times \left(\frac{1}{150} \times 2\right) \times \frac{\sqrt{2}}{\pi} \times 5.8K.$$

In another case where the signal received by the antenna 20 has a medium signal level, the frontend would be operated in a medium-gain (MG) mode. In one exemplary design, since the signal received by the antenna 20 is large enough, meaning that the magnitude of the wanted signal component is larger than the magnitude of the undesired circuit induced noise component, the noise cancellation may be omitted without degrading the signal reception performance. Hence, the transconductance stage 206, the second passive mixer 208 and the fourth passive mixer 2408 are all disabled at the MG mode, resulting in a reduced voltage gain equal to $$10^{(G_{matching}/20)} \times \left(\frac{1}{150}\right) \times \frac{\sqrt{2}}{\pi} \times 5.8K.$$

In another exemplary design, the transconductance stage 206, the second passive mixer 208 and the fourth passive mixer 2408 remain enabled at the MG mode. However, the impedance matching unit 204 and/or the feedback resistors $R_F$ are required to be implemented using tunable elements (e.g., variable resistors). Therefore, the resistance values of the impedance matching unit 204 and/or the feedback resistors $R_F$ are properly adjusted to make the frontend have the desired medium voltage gain.

In yet another case where the signal received by the antenna 20 has a large signal level, the frontend would be operated in a low-gain (LG) mode. In one exemplary design, since the signal received by the antenna 20 is quite large, meaning that the magnitude of the wanted signal component is much larger than the magnitude of the undesired circuit induced noise component, the noise cancellation may be omitted without degrading the signal reception performance. Hence, the transconductance stage 206, the second passive mixer 208 and the fourth passive mixer 2408 are all disabled at the MG mode. Besides, the feedback resistors $R_F$ are required to be implemented using tunable elements (e.g., variable resistors). Hence, the resistance values of feedback resistors $R_F$ are reduced to 1.4KΩ, resulting in a low voltage gain equal to $$10^{(G_{matching}/20)} \times \left(\frac{1}{150}\right) \times \frac{\sqrt{2}}{\pi} \times 1.4K.$$

In another exemplary design, the transconductance stage 206, the second passive mixer 208 and the fourth passive mixer 2408 remain enabled at the MG mode. However, the impedance matching unit 204 and/or the feedback resistors $R_F$ are required to be implemented using tunable elements (e.g., variable resistors). Therefore, the resistance values of the impedance matching unit 204 and/or the feedback resistors $R_F$ are properly adjusted to make the frontend have the desired low voltage gain.

Figure 25:
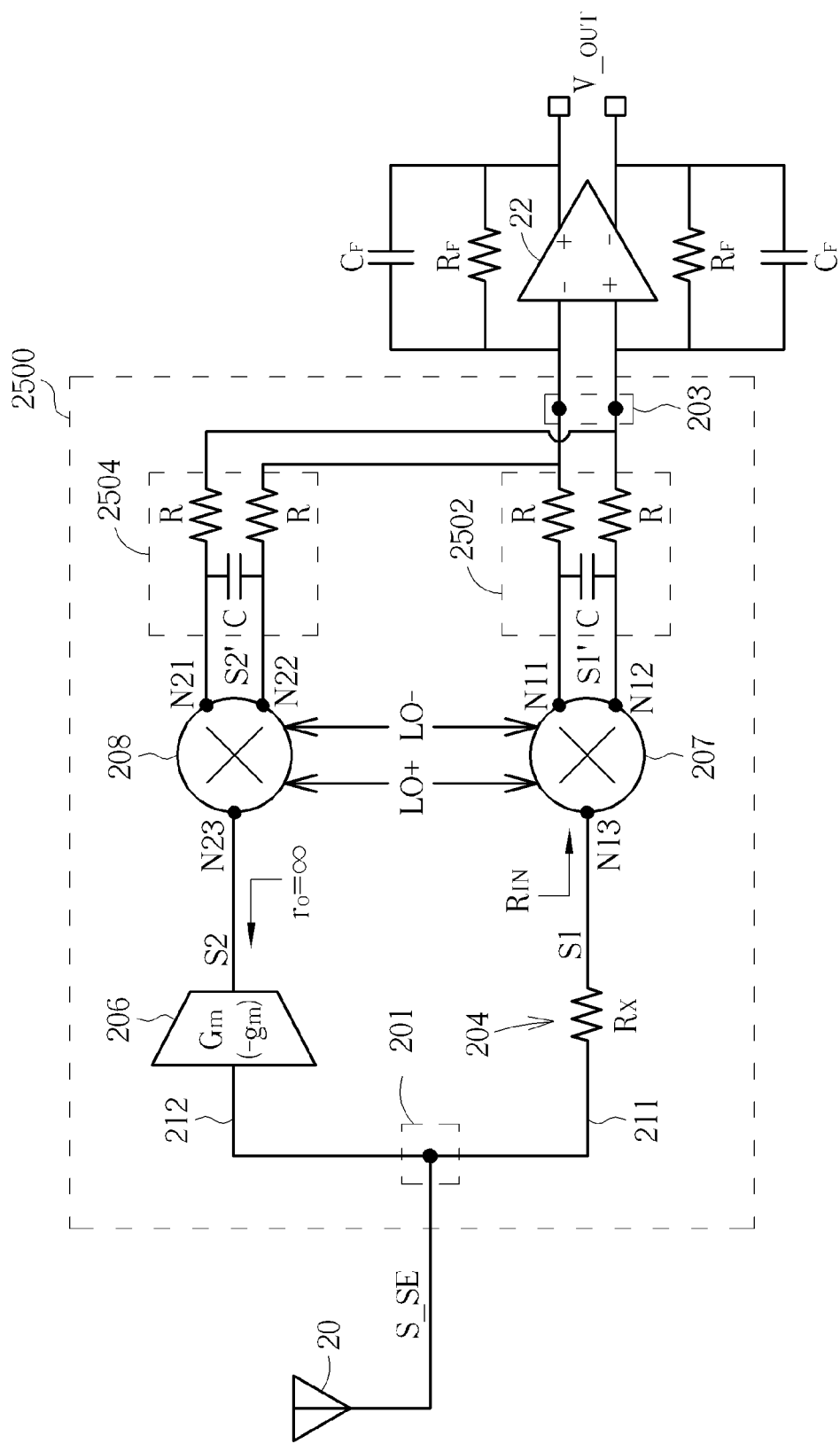
FIG. 25 is a diagram illustrating an alternative design of the signal processing circuit shown in FIG. 2 according to an embodiment of the present invention.

FIG. 25 is a diagram illustrating an alternative design of the signal processing circuit 200 shown in FIG. 2 according to an embodiment of the present invention. The major difference between the signal processing circuits 2500 and 200 is that a first filtering block 2502 is disposed at the first path 211 (i.e., the main path) of the signal processing circuit 2500 and a second filtering block 2504 is disposed at the second path 212 (i.e., the auxiliary path) of the signal processing circuit 2500. By way of example, the first filtering block 2502 is used for processing the first differential mixer output S1' generated from the preceding first passive mixer 207, and the second filtering block 2504 is used for processing the second differential mixer output S2' generated from the preceding second passive mixer 208, where each of the first filtering block 2502 and the second filtering block 2504 may be implemented using a capacitor C and a plurality of resistors R as shown in FIG. 25. The first filtering block 2502 and the second filtering block 2504 are added for out-of-band (OOB) blocker rejection and also beneficial to the noise cancellation. It should be noted that the same concept of adding filtering blocks to the main path and the auxiliary path as shown in FIG. 25 may also be employed in other signal processing circuit(s) (e.g., 500, 600, 800, 900, 1100, 1200, 1300, 1400, 1500, 1600, 1700, 1800, 1900, 2000, 2100, 2200, 2300 and/or 2400), thus providing modified signal processing circuit(s) with better noise performance.

In summary, the present invention proposes a circuit structure which employs a current-scalable noise cancellation operation for cancelling circuit induced noise of an RF circuit and an analog baseband circuit. As the flicker/thermal noise can be cancelled using the proposed circuit structure, the direct-conversion receiver (DCR) would be a very promising architecture for most communication systems (from narrow band to wide band systems), even in advanced semiconductor process (e.g., 20 nm or 28 nm). For example, the proposed circuit structure may be used in an ISM (industrial, scientific and medical) band receiver application, such as WiFi (wireless fidelity) and BT (Bluetooth) with different signal bandwidth. Besides, with the use of the signal scaler in the transconductance stage, the trade-off between noise performance and current consumption can be broken.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal processing circuit with noise cancellation, comprising:
 an impedance matching unit, disposed at a first path, the impedance matching unit arranged to provide input impedance matching, wherein the impedance matching unit is a passive element, and the first path is coupled between a signal input port and a signal output port; and
 a transconductance stage, disposed at a second path, the transconductance stage arranged to guide circuit introduced noise to the signal output port for noise cancellation at the signal output port, wherein the second path is coupled between the signal input port and the signal output port.

2. The signal processing circuit of claim 1, wherein a product of input impedance viewed from the signal input port and transconductance magnitude provided by the transconductance stage is equal to one.

3. The signal processing circuit of claim 1, wherein the transconductance stage comprises a transconductance unit and a signal scaler connected in series.

4. The signal processing circuit of claim 1, further comprising:
 a first passive mixer, disposed at the first path, the first passive mixer arranged to mix an output of the impedance matching unit with a local oscillator (LO) output; and
 a second passive mixer, disposed at the second path, the second passive mixer arranged to mix an output of the transconductance stage with the LO output.

5. The signal processing circuit of claim 4, wherein the LO output includes a first LO signal and a second LO signal having a 180-degree phase difference therebetween; the first passive mixer is arranged to generate a first differential mixer output including a first positive signal and a first negative signal, and has a first output node for outputting the first positive signal and a second output node for outputting the first negative signal; the second passive mixer is arranged to generate a second differential mixer output, including a second positive signal and a second negative signal, according to the first LO signal and the second LO signal, and has a third output node for outputting the second positive signal and a fourth output node for outputting the second negative signal.

6. The signal processing circuit of claim 5, wherein the transconductance stage has a negative transconductance value.

7. The signal processing circuit of claim 5, wherein the transconductance stage has a positive transconductance value.

8. The signal processing circuit of claim 5, wherein one of the first output node and the second output node is coupled to one of the third output node and the fourth output node; and the other of the first output node and the second output node is coupled to the other of the third output node and the fourth output node.

9. The signal processing circuit of claim 8, wherein the first output node is coupled to the fourth output node, and the second output node is coupled to the third output node.

10. The signal processing circuit of claim 8, wherein the first output node is coupled to the third output node; and the second output node is coupled to the fourth output node.

11. The signal processing circuit of claim 8, further comprising:
 a differential transimpedance amplifier, disposed at the first path, the differential transimpedance amplifier arranged for generating a first voltage output corresponding to the first positive signal of the first differential mixer output, and generating a second voltage output corresponding to the first negative signal of the first differential mixer output; and
 a voltage-to-current converting unit, disposed at the first path, the voltage-to-current converting unit arranged for converting the first voltage output into a first current output, and converting the second voltage output into a second current output;
 wherein the first output node is coupled to the third output node through the differential transimpedance amplifier and the voltage-to-current converting unit; and the second output node is coupled to the fourth output node through the differential transimpedance amplifier and the voltage-to-current converting unit.

12. The signal processing circuit of claim 8, further comprising:
 a differential transimpedance amplifier, disposed at the second path, the differential transimpedance amplifier arranged for generating a first voltage output corresponding to the second positive signal of the second differential mixer output and generating a second voltage output corresponding to the second negative signal of the second differential mixer output; and
 a voltage-to-current converting unit, disposed at the second path, the voltage-to-current converting unit arranged for converting the first voltage output into a first current output, and converting the second voltage output into a second current output;

wherein the first output node is coupled to the third output node through the differential transimpedance amplifier and the voltage-to-current converting unit; and the second output node is coupled to the fourth output node through the differential transimpedance amplifier and the voltage-to-current converting unit.

13. The signal processing circuit of claim 5, wherein an input signal is received at the signal input port, and processed by the impedance matching unit and the transconductance stage, respectively.

14. The signal processing circuit of claim 13, wherein the input signal is a differential signal.

15. The signal processing circuit of claim 13, wherein the input signal is a single-ended signal.

16. The signal processing circuit of claim 1, wherein the signal output port is coupled to a passive mixer for providing an output signal to the passive mixer.

17. The signal processing circuit of claim 16, wherein the transconductance stage has a negative transconductance value; a differential signal is received at the signal input port, and processed by the impedance matching unit and the transconductance stage, respectively; the differential signal includes a positive signal and a negative signal; the impedance matching unit has a first output node responsive to the positive signal and a second output node responsive to the negative signal; the transconductance stage has a third output node responsive to the positive signal and a fourth output node responsive to the negative signal; the first output node is coupled to the fourth output node; and the second output node is coupled to the third output node.

18. The signal processing circuit of claim 16, wherein the transconductance stage has a positive transconductance value; a differential signal is received at the signal input port, and processed by the impedance matching unit and the transconductance stage, respectively; the differential signal includes a positive signal and a negative signal; the impedance matching unit has a first output node responsive to the positive signal and a second output node responsive to the negative signal; the transconductance stage has a third output node responsive to the positive signal and a fourth output node responsive to the negative signal; the first output node is coupled to the third output node; and the second output node is coupled to the fourth output node.

19. The signal processing circuit of claim 1, wherein the impedance matching unit is a tunable.

20. The signal processing circuit of claim 1, wherein the signal processing circuit is part of a frontend of a wireless receiver.

21. The signal processing circuit of claim 20, wherein the wireless receiver is a quadrature receiver.

22. A signal processing circuit with noise cancellation, comprising:
    a first voltage-to-current converting unit, arranged to convert a voltage input into a first current output;
    a second voltage-to-current converting unit, arranged to convert the voltage input into a second current output; and
    a current-mode noise cancellation unit, arranged to combine a plurality of current signals derived from the first current output and the second current output for circuit introduced noise cancellation;
    wherein one of the first voltage-to-current converting unit and the second voltage-to-current converting unit is a passive element.

* * * * *